United States Patent
Park et al.

(10) Patent No.: US 11,977,329 B2
(45) Date of Patent: May 7, 2024

(54) PHOTOSENSITIVE COMPOSITIONS, PREPARATION METHODS THEREOF, AND QUANTUM DOT POLYMER COMPOSITE PREPARED THEREFROM

(71) Applicants: SAMSUNG ELECTRONICS CO., LTD., Suwon-si (KR); SAMSUNG SDI CO., LTD., Yongin-si (KR)

(72) Inventors: Shang Hyeun Park, Yongin-si (KR); Hojeong Paek, Suwon-si (KR); Eun Joo Jang, Suwon-si (KR); Shin Ae Jun, Seongnam-si (KR)

(73) Assignees: SAMSUNG ELECTRONICS CO., LTD., Gyeonggi-do (KR); SAMSUNG SDI CO, LTD., Gyeonggi-do (KR)

( * ) Notice: Subject to any disclaimer, the term of this patent is extended or adjusted under 35 U.S.C. 154(b) by 522 days.

(21) Appl. No.: 17/207,501

(22) Filed: Mar. 19, 2021

(65) Prior Publication Data

US 2021/0286259 A1    Sep. 16, 2021

Related U.S. Application Data

(62) Division of application No. 15/241,224, filed on Aug. 19, 2016, now Pat. No. 10,983,433.

(30) Foreign Application Priority Data

Aug. 21, 2015  (KR) .................. 10-2015-0118208

(51) Int. Cl.
*G03F 7/00* (2006.01)
*C08F 220/14* (2006.01)
(Continued)

(52) U.S. Cl.
CPC .......... *G03F 7/0007* (2013.01); *C08F 220/14* (2013.01); *C09D 4/06* (2013.01);
(Continued)

(58) Field of Classification Search
CPC ....... G03F 7/0007; G03F 7/033; G03F 7/0042
See application file for complete search history.

(56) References Cited

U.S. PATENT DOCUMENTS 7,166,412 B2   1/2007  Park et al.
7,294,449 B1   11/2007 Gudeman et al.
(Continued)

FOREIGN PATENT DOCUMENTS

CN   101356006 A   1/2009
CN   103059393 A   4/2013
(Continued)

OTHER PUBLICATIONS

English Translation of Office Action dated Jul. 9, 2021, issued in corresponding Chinese Patent Application No. 201610701845.2.
(Continued)

*Primary Examiner* — John S Chu
(74) *Attorney, Agent, or Firm* — CANTOR COLBURN LLP

(57) ABSTRACT

A photosensitive composition including a quantum dot dispersion, a reactive compound having at least two thiol groups, a photopolymerizable monomer having a carbon-carbon double bond, and a photoinitiator, wherein the quantum dot dispersion includes a carboxylic acid group-containing polymer and a quantum dot dispersed in the carboxylic acid group containing polymer, and wherein the carboxylic acid group-containing polymer includes a copolymer of a monomer combination including a first monomer having a carboxylic acid group and a carbon-carbon double bond and a second monomer having a carbon-carbon double bond and a hydrophobic moiety and not having a carboxylic acid group.

21 Claims, 14 Drawing Sheets

(51) Int. Cl.
| | |
|---|---|
| *C09D 4/06* | (2006.01) |
| *C09K 11/02* | (2006.01) |
| *C09K 11/70* | (2006.01) |
| *G02B 5/20* | (2006.01) |
| *G02B 5/22* | (2006.01) |
| *G03F 7/004* | (2006.01) |
| *G03F 7/033* | (2006.01) |
| *B82Y 30/00* | (2011.01) |
| *B82Y 40/00* | (2011.01) |

(52) U.S. Cl.
CPC .......... *C09K 11/02* (2013.01); *C09K 11/703* (2013.01); *G02B 5/207* (2013.01); *G02B 5/223* (2013.01); *G03F 7/004* (2013.01); *G03F 7/0042* (2013.01); *G03F 7/0047* (2013.01); *G03F 7/033* (2013.01); *B82Y 30/00* (2013.01); *B82Y 40/00* (2013.01)

(56) References Cited

U.S. PATENT DOCUMENTS

| | | | |
|---|---|---|---|
| 7,341,828 | B2 | 3/2008 | Katoh et al. |
| 7,473,513 | B1 | 1/2009 | Park et al. |
| 7,977,400 | B2 | 7/2011 | Taniguchi et al. |
| 8,071,701 | B2 | 12/2011 | Klosin et al. |
| 8,158,308 | B2 | 4/2012 | Murakami et al. |
| 8,268,519 | B2 | 9/2012 | Nakashima et al. |
| 8,383,753 | B2 | 2/2013 | Klosin et al. |
| 8,921,827 | B2 | 12/2014 | Pickett et al. |
| 9,082,982 | B2 | 7/2015 | Jun et al. |
| 9,382,470 | B2 | 7/2016 | Kang et al. |
| 9,461,215 | B2 | 10/2016 | Pickett et al. |
| 9,701,901 | B2 | 7/2017 | Kang et al. |
| 9,778,510 | B2 | 10/2017 | Won et al. |
| 9,904,109 | B2 | 2/2018 | Han |
| 10,001,671 | B2 | 6/2018 | Won et al. |
| 10,014,452 | B2 | 7/2018 | Pickett et al. |
| 10,108,089 | B2 | 10/2018 | Gu et al. |
| 10,138,390 | B2 | 11/2018 | Atsushi |
| 10,203,599 | B2 | 2/2019 | Kim |
| 10,246,634 | B2 | 4/2019 | Yang et al. |
| 2003/0066998 | A1 | 4/2003 | Lee |
| 2008/0070153 | A1 | 3/2008 | Ioku et al. |
| 2009/0017268 | A1 | 1/2009 | Skipor et al. |
| 2011/0223110 | A1 | 9/2011 | Bartel |
| 2012/0001217 | A1 | 1/2012 | Kang et al. |
| 2013/0099213 | A1 | 4/2013 | Jun et al. |
| 2013/0148057 | A1 | 6/2013 | Kang et al. |
| 2015/0098212 | A1 | 4/2015 | Won et al. |
| 2016/0011506 | A1 | 1/2016 | Gu et al. |
| 2017/0059986 | A1 | 3/2017 | Jun et al. |
| 2017/0115562 | A1 | 4/2017 | Kim et al. |
| 2017/0176816 | A1 | 6/2017 | Han et al. |
| 2017/0306228 | A1 | 10/2017 | Kang et al. |
| 2018/0044583 | A1 | 2/2018 | Kwon et al. |
| 2019/0016952 | A1 | 1/2019 | Qiu et al. |

FOREIGN PATENT DOCUMENTS

| | | | | |
|---|---|---|---|---|
| CN | 103080081 | A | 5/2013 | |
| CN | 103497543 | A | 1/2014 | |
| CN | 103728837 | A | 4/2014 | |
| CN | 104513335 | A | 9/2018 | |
| EP | 1526584 | A2 | 4/2005 | |
| EP | 2584623 | A2 | 4/2013 | |
| EP | 3136174 | A1 | 3/2017 | |
| EP | 3147708 | A1 | 3/2017 | |
| EP | 3564750 | A1 | 11/2019 | |
| JP | 2013145364 | A | 7/2013 | |
| JP | 2015121702 | A | 7/2015 | |
| KR | 100965373 | B1 | 6/2010 | |
| KR | 20110084324 | A | 7/2011 | |
| KR | 20130044071 | A | 5/2013 | |
| WO | 2009079061 | A2 | 6/2009 | |
| WO | WO-2013140083 | A1 * | 9/2013 | .......... B82Y 30/00 |
| WO | 2015100968 | A1 | 7/2015 | |

OTHER PUBLICATIONS

Office Action dated Jul. 9, 2021, issued in corresponding Chinese Patent Application No. 201610701845.2.
English Translation of Office Action dated Jul. 27, 2023 of the corresponding Korean Patent Application No. 10-2016-0105962, 13 pp.
Office Action dated Jul. 27, 2023 of the corresponding Korean Patent Application No. 10-2016-0105962, 11 pp.
Dominik Janczewski, et al., "Synthesis of Functionalzied amphiphilic polymers for coating quantum dots", Nature Protocols, 1546, vol. 6, No. 10, 2011.
English Translation of Office Action dated Nov. 4, 2020, of the corresponding Chinese Patent Application No. 201610701845.2.
English Translation of Office Action dated Nov. 4, 2020, of the corresponding Chinese Patent Application No. 201610703071.7.
Extended European Search Report dated Feb. 1, 2017 of the corresponding European Patent Application No. 161849807.
Extended European Search Report dated Feb. 24, 2017 of the corresponding European Patent Application No. 1618449229.
Extended European Search Report dated Oct. 8, 2019 of the corresponding European Patent Application No. 19176444.
Office Action dated Nov. 4, 2020, of the corresponding Chinese Patent Application No. 201610701845.2.
Office Action dated Nov. 4, 2020, of the corresponding Chinese Patent Application No. 201610703071.7.
Korean Office Action for Korean Patent Application No. 10-2016-0105963 dated Oct. 10, 2023.

* cited by examiner

Repeating the Patterning Process three times

PHOTOSENSITIVE COMPOSITIONS, PREPARATION METHODS THEREOF, AND QUANTUM DOT POLYMER COMPOSITE PREPARED THEREFROM

CROSS-REFERENCE TO RELATED APPLICATION

This is a divisional application that claims priority to U.S. application Ser. No. 15/241,224 filed Aug. 19, 2016, which in turn claims priority to Korean Patent Application No. 10-2015-0118208 filed in the Korean Intellectual Property Office on Aug. 21, 2015, and all the benefits accruing therefrom under 35 U.S.C. §§ 119; 120, the contents of which are incorporated herein by reference in their entirety.

BACKGROUND

1. Field

A photosensitive composition, a method of preparation thereof, a quantum dot-polymer composite prepared therefrom, and an electronic device including the same are disclosed.

2. Description of the Related Art

By colloidal synthesis, the particle size of quantum dots (QD) may be relatively freely and uniformly controlled. The QDs having a size of less than or equal to about 10 nanometers may exhibit a more significant quantum confinement effect as their size decreases and thereby their bandgap increases. In this case, the energy density of the QDs may be enhanced.

The QDs are applicable for various display devices (e.g., LCD) in the form of a QD-polymer composite.

For the application of the QD-polymer composites in various devices, there remains a need to develop a technique for patterning the quantum dot-polymer composite.

SUMMARY

An embodiment is related to a photosensitive composition capable of preparing a pattern of a quantum dot-polymer composite or a patternable quantum dot-polymer composite.

Another embodiment is related to a production method of the aforementioned photosensitive composition.

Another embodiment is related to a quantum dot-polymer composite prepared from the aforementioned photosensitive composition.

Yet another embodiment provides a color filter including the quantum dot-polymer composite.

Yet another embodiment provides a display device including the quantum dot-polymer composite.

In an embodiment, a photosensitive composition includes:
a quantum dot (e.g., a plurality of quantum dots);
a carboxylic acid group (—COOH)-containing polymer;
a reactive compound having at least two thiol groups;
a photopolymerizable monomer having a carbon-carbon double bond; and
a photoinitiator,
wherein the carboxylic acid group (—COOH)-containing polymer includes a copolymer of a monomer combination including a first monomer having a carboxylic acid group and a carbon-carbon double bond and a second monomer having a carbon-carbon double bond and a hydrophobic moiety and not having a carboxylic acid group.

The plurality of quantum dots may be dispersed by the carboxylic acid group (—COOH)-containing polymer in the composition. Therefore, the photosensitive composition includes a quantum dot dispersion including the carboxylic acid group (—COOH)-containing polymer and a quantum dot dispersed in the carboxylic acid group containing polymer.

The quantum dot may include an organic ligand bound to a surface thereof.

The organic ligand may have a hydrophobic moiety.

In some embodiments, the organic ligand does not include a photopolymerizable functional group.

The organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C5 to C24 aliphatic hydrocarbon group or a C5 to C20 aromatic hydrocarbon group), a polymeric organic ligand, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

The carboxylic acid group-containing polymer may have an acid value of greater than or equal to about 50 milligrams of KOH per gram and less than or equal to about 200 milligrams of KOH per gram.

The carboxylic acid group-containing polymer may have an acid value between about 100 milligrams of KOH per gram and 200 milligrams of KOH per gram.

The copolymer may include a first repeating unit derived from the first monomer and a second repeating unit derived from the second monomer, and the first repeating unit may include a repeating unit represented by Chemical Formula 1-1, a repeating unit represented by Chemical Formula 1-2, or a combination thereof:

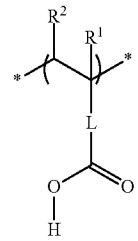

Chemical Formula 1-1 wherein
$R^1$ is hydrogen, a C1 to C3 alkyl group, or —$(CH_2)_{n1}$—COOH (wherein n1 is 0 to 2),
$R^2$ is hydrogen, a C1 to C3 alkyl group, or —COOH,
L is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and
* indicates a portion linked to an adjacent atom;

Chemical Formula 1-2

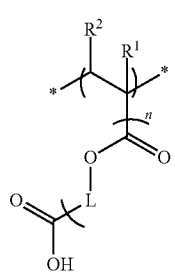

wherein

R¹ is hydrogen, a C1 to C3 alkyl group, or —(CH$_2$)$_{n1}$—COOH (wherein n1 is 0 to 2), R² is hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, n is an integer of 1 to 3, and

* indicates a portion linked to an adjacent atom.

The second repeating unit may include a repeating unit represented by Chemical Formula 2, a repeating unit represented by Chemical Formula 4, a repeating unit represented by Chemical Formula 5, a repeating unit represented by Chemical Formula A, or a combination thereof:

Chemical Formula 2

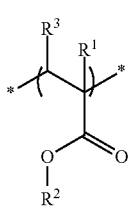

wherein

R¹ is hydrogen or a C1 to C3 alkyl group,

R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R³ is hydrogen or a C1 to C3 alkyl group, and

* indicates a portion linked to an adjacent atom;

Chemical Formula 4

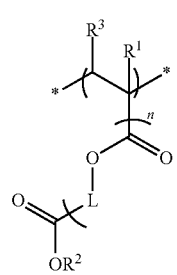

wherein

R¹ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R³ is hydrogen or a C1 to C3 alkyl group, n is an integer of 1 to 3, and

* indicates a portion linked to an adjacent atom;

Chemical Formula 5

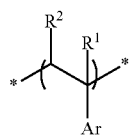

wherein each of R¹ and R² is independently hydrogen or a C1 to C3 alkyl group,

Ar is a substituted or unsubstituted C6 to C30 aromatic hydrocarbon group or a substituted or unsubstituted C6 to C30 alicyclic hydrocarbon group, and

* indicates a portion linked to an adjacent atom;

Chemical Formula A

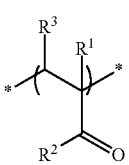

wherein

R¹ is hydrogen or a C1 to C3 alkyl group,

R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, R³ is hydrogen or a C1 to C3 alkyl group, and

* indicates a portion linked to an adjacent atom.

The monomer combination may further include a third monomer having a carbon-carbon double bond and a hydrophilic moiety and not having a carboxylic acid group.

The copolymer may include a third repeating unit derived from the third monomer and the third repeating unit may be represented by Chemical Formula 3:

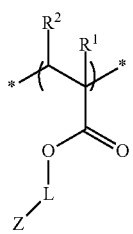

Chemical Formula 3 wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group) and

* indicates a portion linked to an adjacent atom.

In the copolymer, an amount of the first repeating unit may be greater than or equal to about 5 mole percent and less than or equal to about 95 mole percent.

The carboxylic acid group-containing polymer may be a copolymer of a first monomer selected from (meth)acrylic acid and at least one second or third monomer selected from arylalkyl(meth)acrylate, hydroxyalkyl (meth)acrylate, and styrene.

A weight average molecular weight of the carboxylic acid group-containing polymer may be greater than or equal to about 1,000 grams per mole and less than or equal to about 100,000 grams per mole.

The reactive compound may be represented by Chemical Formula 6:

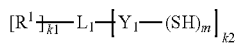

Chemical Formula 6 wherein, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a C1 to C10 alkoxy group, a hydroxy group, —NH₂, a substituted or unsubstituted C1 to C30 amine group (—NRR', wherein R and R' are independently hydrogen or a C1 to C30 linear or branched alkyl group), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)ONRR' (wherein R and R' are independently hydrogen or a C1 to C20 linear or branched alkyl group) or a combination thereof, $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—CH₂—) of the substituted or unsubstituted C1 to C30 alkylene group may be replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH₂—) is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The reactive compound may include a compound of Chemical Formula 6-1:

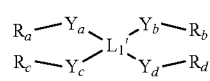

Chemical Formula 6-1 wherein $L_1'$ is carbon, a substituted or unsubstituted C2 to C20 group derived from an alkane, a substituted or unsubstituted C6 to C30 group derived from an arene, a substituted or unsubstituted C3 to C30 group derived from a heteroarene, a substituted or unsubstituted C3 to C30 group derived from a cycloalkane, or a substituted or unsubstituted C3 to C30 group derived from a heterocycloalkane, each of $Y_a$ to $Y_d$ is independently a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH₂—) is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is $R^1$ of Chemical Formula 6 or SH, provided that at least two of $R_a$ to $R_d$ are SH.

The reactive compound may be ethoxylated pentaerythritol tetra(3-mercaptopropionate), trimethylolpropane tri(3-mercaptopropionate), trimethylolpropane-tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, trimethylolpropane tris(3-mercaptopropionate), tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

The photopolymerizable monomer including a carbon-carbon double bond may include a diacrylate compound, a triacrylate compound, a tetraacrylate compound, a pentaacrylate compound, a hexaacrylate compound, or a combination thereof.

The photosensitive composition may be developable by an alkali aqueous solution.

A polymer composite prepared from the photosensitive composition may show a blue light conversion rate that is greater than or equal to about 30% (or greater than or equal to about 40%) of its initial value after being heated at 180° C. for 30 minutes.

The photosensitive composition may further include a solvent and may include:
  about 1 weight percent to about 40 weight percent of the quantum dots;
  about 0.5 weight percent to about 35 weight percent of the carboxylic acid group-containing binder;
  about 0.5 weight percent to about 30 weight percent of the photopolymerizable monomer;
  about 0.1 weight percent to about 40 weight percent of the reactive compound;
  about 0.01 weight percent to about 10 weight percent of the photoinitiator; and
  a balance amount of the solvent based on the total weight of the composition.

The photosensitive composition may further include a light diffusing agent selected from a metal oxide particle, a metal particle, and a combination thereof.

The photosensitive composition may further include a dispersant for the light diffusing agent.

The photosensitive composition may further include a dispersant for the quantum dots.

In another embodiment, a production method of the aforementioned photosensitive composition includes:
  dissolving a carboxylic acid group (—COOH)-containing polymer in a solvent to prepare a solution;
  combining a plurality of quantum dots (that may have an organic ligand bound to a surface thereof) with the solution to obtain a quantum dot dispersion; and
  combining the quantum dot dispersion with at least one of a reactive compound having at least two thiol groups, a photopolymerizable monomer having a carbon-carbon double bond, a photoinitiator, and a solvent.

In another embodiment, a quantum dot-polymer composite includes:
  a matrix including a carboxylic acid group (—COOH)-containing polymer and a polymerization product of a photopolymerizable monomer having a carbon-carbon double bond and a reactive compound having at least two thiol groups; and
  a plurality of quantum dots that may include an organic ligand bound to a surface thereof;
    wherein the COOH-containing polymer includes a copolymer of a monomer combination including a first monomer having a carboxylic acid group and a carbon-carbon double bond and a second monomer having a carbon-carbon double bond and a hydrophobic moiety and not having a carboxylic acid group; and
    the plurality of quantum dots are dispersed (e.g., separated from one another) in the matrix (e.g., without agglomeration).

The copolymer may be a linear polymer. The photopolymerizable monomer may include a monomer having at least three (meth)acrylate groups and the polymerization product may include a crosslinked polymer.

The organic ligand may include a hydrophobic moiety and it may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C5 to C24 aliphatic hydrocarbon group or a C5 to C20 aromatic hydrocarbon group), a polymeric organic ligand, or a combination thereof.

The carboxylic acid group-containing polymer may have an acid value of greater than about 60 milligrams of KOH per gram and less than or equal to about 200 milligrams of KOH per gram.

In the photosensitive composition, the copolymer may include a first repeating unit derived from the first monomer and a second repeating unit derived from the second monomer, and the first repeating unit may include a repeating unit represented by Chemical Formula 1-1, a repeating unit represented by Chemical Formula 1-2, or a combination thereof:

Chemical Formula 1-1

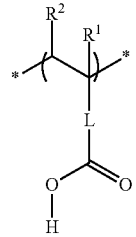

wherein
$R^1$ is hydrogen, a C1 to C3 alkyl group, or —$(CH_2)_{n1}$—COOH (wherein n1 is 0 to 2), $R^2$ is hydrogen, a C1 to C3 alkyl group, or —COOH, L is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and

* indicates a portion linked to an adjacent atom;

Chemical Formula 1-2

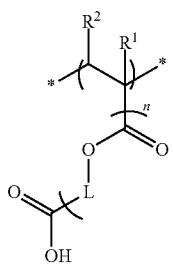

wherein
R¹ is hydrogen, a C1 to C3 alkyl group, or —(CH$_2$)$_{n1}$—COOH (wherein n1 is 0 to 2),
R² is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
n is an integer of 1 to 3, and
* indicates a portion linked to an adjacent atom.

The second repeating unit may include a repeating unit represented by Chemical Formula 2, a repeating unit represented by Chemical Formula 4, a repeating unit represented by Chemical Formula 5, a repeating unit represented by Chemical Formula A, or a combination thereof:

Chemical Formula 2

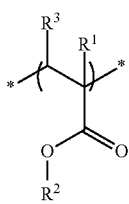

wherein
R¹ is hydrogen or a C1 to C3 alkyl group,
R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
R³ is hydrogen or a C1 to C3 alkyl group, and
* indicates a portion linked to an adjacent atom;

Chemical Formula 4

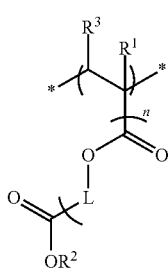

wherein
R¹ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
R³ is hydrogen or a C1 to C3 alkyl group,
n is an integer of 1 to 3, and
* indicates a portion linked to an adjacent atom;

Chemical Formula 5

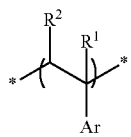

wherein
each of R¹ and R² is independently hydrogen or a C1 to C3 alkyl group,
Ar is a substituted or unsubstituted C6 to C30 aromatic hydrocarbon group or a substituted or unsubstituted C6 to C30 alicyclic hydrocarbon group, and
* indicates a portion linked to an adjacent atom;

Chemical Formula A

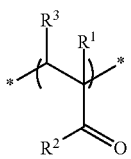

wherein
R¹ is hydrogen or a C1 to C3 alkyl group,
R² is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
R³ is hydrogen or a C1 to C3 alkyl group, and
* indicates a portion linked to an adjacent atom.

The monomer combination may further include a third monomer having a carbon-carbon double bond and a hydrophilic moiety and not having a carboxylic acid group.

The copolymer may include a third repeating unit derived from the third monomer, and the third repeating unit may be represented by Chemical Formula 3:

Chemical Formula 3

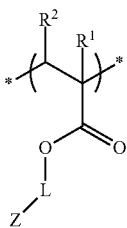

wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

In the carboxylic acid group-containing polymer, an amount of the first repeating unit may be greater than or equal to about 5 mole percent and less than or equal to about 95 mole percent.

The reactive compound may be represented by Chemical Formula 6:

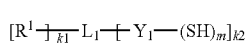

Chemical Formula 6 wherein $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a C1 to C10 alkoxy group, a hydroxy group, —NH$_2$, a substituted or unsubstituted C1 to C30 amine group (—NRR', wherein R and R' are independently hydrogen or a C1 to C30 linear or branched alkyl group), an isocyanate group, a halogen, —ROR' (wherein R is a substituted or unsubstituted C1 to C20 alkylene group, and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)ONRR' (wherein R and R' are independently hydrogen or a C1 to C20 linear or branched alkyl group) or a combination thereof, $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—CH$_2$—) of the substituted or unsubstituted C1 to C30 alkylene group may be replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that when $Y_1$ is not a single bond, m does not exceed the valence of $Y_1$, and provided that the sum of k1 and k2 does not exceed the valence of $L_1$.

The reactive compound may include a compound of Chemical Formula 6-1:

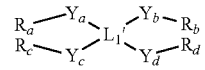

Chemical Formula 6-1 wherein, $L_1'$ is carbon, a substituted or unsubstituted C2 to C20 group derived from an alkane, a substituted or unsubstituted C6 to C30 group derived from an arene, a substituted or unsubstituted C3 to C30 group derived from a heteroarene, a substituted or unsubstituted C3 to C30 group derived from a cycloalkane, or a substituted or unsubstituted C3 to C30 group derived from a heterocycloalkane, each of $Y_a$ to $Y_d$ is independently a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ are $R^1$ of Chemical Formula 6 or SH, provided that at least two of $R_a$ to $R_d$ are SH.

The quantum dot-polymer composite may be a pattern.

Another embodiment provides a color filter including the aforementioned quantum dot-polymer composite.

Yet another embodiment provides a display device including the quantum dot-polymer composite.

The aforementioned photosensitive composition may prepare a quantum dot-polymer composite pattern in an environmentally friendly manner.

The photosensitive composition of the embodiments may be applied to a conventional photo-resist process without any additional surface treatment for the quantum dots. The pattern thus prepared may show enhanced stability even under heat-treatment carried out during the photo-resist process.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
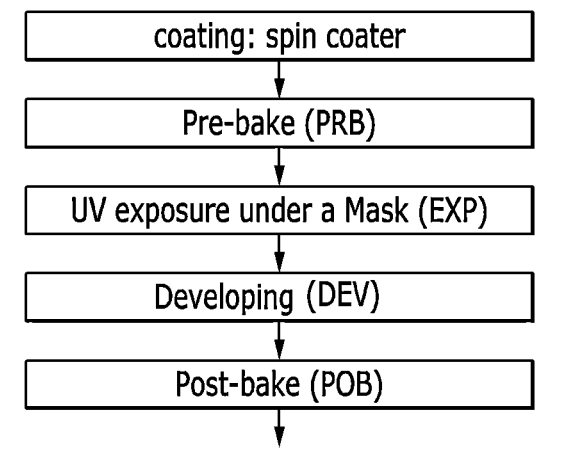
FIG. 1 is a view showing a pattern forming process according to an embodiment to explain critical dimension uniformity.
Figure 1:

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. If not defined otherwise, all terms (including technical and scientific terms) in the specification may be defined as commonly understood by one skilled in the art. The terms defined in a generally-used dictionary should be interpreted as having a meaning that is consistent with their meaning in the context of the relevant art and the present disclosure, and may not be interpreted ideally or overly broad unless clearly defined. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "alkyl group" refers to a group derived from a straight or branched chain saturated aliphatic hydrocarbon having the specified number of carbon atoms and having a valence of at least one.

As used herein, the term "alkoxy group" refers to "alkyl-O—", wherein the term "alkyl" has the same meaning as described above.

As used herein, the term "alkenyl group" may refer to a straight or branched chain, monovalent hydrocarbon group having at least one carbon-carbon double bond.

As used herein, the term "alkynyl group" refers to a straight or branched chain, monovalent hydrocarbon group having at least one carbon-carbon triple bond.

As used herein, the term "cycloalkyl group" refers to a monovalent group having one or more saturated rings in which all ring members are carbon.

As used herein, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, the term "heteroaryl group" refers to an aryl group including carbon and 1 to 3 heteroatoms selected from the group consisting of N, O, S, and P as ring atoms.

As used herein, the term "arylalkyl group" refers to a substituted or unsubstituted aryl group covalently linked to an alkyl group that is linked to a compound.

As used herein, the term "heteroarylalkyl group" refers to a substituted or unsubstituted heteroaryl group covalently linked to an alkyl group that is linked to a compound.

As used herein, when a definition is not otherwise provided, the term "substituted" refers to a compound or a group or a moiety wherein at least one of hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C20 alkyl" refers to a C1 to C20 alkyl group substituted with a C6 to C20 aryl group, the total number of carbon atoms in the resulting aryl substituted alkyl group is C7 to C40.

As used herein, the term "monovalent organic functional group" refers to a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of one to three heteroatoms selected from N, O, S, Si, and P.

As used herein, the term "alkylene group" refers to a straight or branched saturated aliphatic hydrocarbon group having a valence of at least two, optionally substituted with one or more substituents. The term "arylene group" refers to a functional group having a valence of at least two obtained by removal of at least two hydrogens in an aromatic ring, optionally substituted with one or more substituents.

As used herein, the term "alkenylene group" refers to a straight or branched aliphatic hydrocarbon group having a valence of at least two, having at least one carbon-carbon double bond, optionally substituted with one or more substituents where indicated, provided that the valence of the alkenylene group is not exceeded.

As used herein, the term "cycloalkylene group" refers to a cyclic hydrocarbon group having a valence of at least two, optionally substituted with one or more substituents where indicated, provided that the valence of the cycloalkylene group is not exceeded.

As used herein, the term "arylene group" refers to a functional group having a valence of at least two obtained by removal of two hydrogens in an aromatic ring, optionally substituted with one or more substituents where indicated, provided that the valence of the arylene group is not exceeded.

As used herein, the term "heteroarylene group" refers to a functional group having a valence of at least two obtained by removal of two hydrogens in an aromatic ring, containing one to three heteroatoms selected from the group consisting of N, O, S, Si, and P as ring-forming elements, optionally substituted with one or more substituents where indicated, provided that the valence of the heteroarylene group is not exceeded.

As used herein, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, the term "(meth)acrylate" refers to acrylate and/or methacrylate.

As used herein, the term "hydrophobic moiety" refers to a moiety that causes a given compound including the same to show agglomeration in an aqueous solution and to have a tendency to repel water. For example, the hydrophobic moiety may include an aliphatic hydrocarbon group having a carbon number of greater than or equal to 2 (alkyl, alkenyl, alkynyl, etc.), an aromatic hydrocarbon group having a carbon number of greater than or equal to 6 (phenyl, naphthyl, arylalkyl group, etc.), or an alicyclic hydrocarbon group having a carbon number of greater than or equal to 5 (cyclohexyl, norbornenyl, etc.). The hydrophobic moiety substantially lacks an ability to make a hydrogen bond with an ambient medium and is not substantially mixed with the medium as its polarity does not match that of the medium.

As used herein, the term "group" refers to a group of Periodic Table.

As used herein, "Group II" refers to Group IIA and Group IIB, and examples of Group metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

As used herein, the term "visible light" refers to light having a wavelength of about 390 nanometers (nm) to about 700 nm. As used herein, the term "UV light" refers to light having a wavelength of greater than or equal to about 200 nm and less than about 390 nm.

As used herein, the term "blue light conversion rate" refers to a ratio of emitted light with respect to incident light. In some embodiments, the blue light conversion rate may be a ratio of emitted light amount of the quantum dot polymer composite to the absorbed light amount thereof from the excitation light (e.g., blue light), A total amount of the excitation light (e.g., a total amount of the blue light, B) may be obtained by integrating a photoluminescent spectrum of the excitation light. A PL spectrum of the quantum dot polymer composite is obtained and from the PL spectrum thus obtained, an amount of the blue light (B') and an amount of the light (A) that is emitted from the quantum dot polymer composite and has a green and/or red wavelength range are measured, respectively. Then, the light conversion rate is calculated by the following equation:

$$A/(B-B') \times 100 = \text{light conversion rate (\%)}.$$

As used herein, the term "dispersion" refers to a dispersion wherein a dispersed phase is a solid and a continuous phase includes a liquid. For example, the term "dispersion" may refer to a colloidal dispersion wherein the dissolved or dispersed phase has a dimension of about 1 nm to about 1 micrometer (μm).

Hereinafter, the term "binder" or "carboxylic acid group-containing binder" refers to the "carboxylic acid group-containing polymer."

In an embodiment, a photosensitive composition includes:
a plurality of quantum dots (that may have an organic ligand on a surface thereof);
a carboxylic acid group (—COOH)-containing polymer
a reactive compound having at least two thiol groups;
a photopolymerizable monomer having a carbon-carbon double bond; and
a photoinitiator.

The carboxylic acid group (—COOH)-containing polymer includes a copolymer of a monomer combination including a first monomer having a carboxylic acid group and a carbon-carbon double bond and a second monomer having a carbon-carbon double bond and a hydrophobic moiety and not having a carboxylic acid group.

The plurality of quantum dots may be dispersed (for example, separated from one another) by the carboxylic acid group (—COOH)-containing polymer to form a quantum dot dispersion. The quantum dot dispersion includes the carboxylic acid group (—COOH)-containing polymer and the plurality of quantum dots dispersed in the carboxylic acid group (—COOH)-containing polymer. The quantum dot dispersion may further include a solvent.

The quantum dot (hereinafter also referred to as a semiconductor nanocrystal) is not particularly limited, and may be prepared in any known method or is a commercially available. For example, the quantum dot may be a Group II-VI compound, a Group III-V compound, a Group IV-VI compound, a Group IV element or compound, a Group I-III-VI compound, a Group I-II-IV-VI compound, or a combination thereof.

The Group II-VI compound may be selected from:
a binary element compound selected from CdSe, CdTe, ZnS, ZnSe, ZnTe, ZnO, HgS, HgSe, HgTe, MgSe, MgS, and a combination thereof;
a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and
a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group II-VI compound may further include a Group III metal.

The Group III-V compound may be selected from:
a binary element compound selected from GaN, GaP, GaAs, GaSb, AlN, AlP, AlAs, AlSb, InN, InP, InAs, InSb, and a combination thereof;
a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof; and
a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group III-V compound may further include a Group II metal (e.g., InZnP).

The Group IV-VI compound may be selected from:
a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

a single-element selected from Si, Ge, and a combination thereof; and a binary element compound selected from SiC, SiGe, and a combination thereof.

The binary element compound, the ternary element compound or the quaternary element compound may be respectively included in a uniform concentration in the particle or partially different concentrations in the same particle. The semiconductor nanocrystal particle may have a core-shell structure wherein a first semiconductor nanocrystal is surrounded by a second semiconductor nanocrystal that is different from the first semiconductor nanocrystal. The interface between the core and the shell may have a concentration gradient wherein the concentration of an element of the shell decreases toward the core. In addition, the semiconductor nanocrystal particle may have a semiconductor nanocrystal core and a multi-layered shell surrounding the semiconductor nanocrystal core. The core and multi-layered shell structure has at least two layers of the shell wherein each layer may be a single composition, an alloy, or the one having a concentration gradient.

In the semiconductor nanocrystal particle, the materials of the shell may have a larger energy bandgap than that of the core, and thereby the semiconductor nanocrystal may exhibit a quantum confinement effect more effectively. In case of a multi-layered shell type of semiconductor nanocrystal particle, the bandgap of the material of an outer layer of the shell may be higher energy than that of the material of an inner layer of the shell (a layer that is closer to the core). In this case, the semiconductor nanocrystal particle may emit light of a UV to infrared wavelength range.

The semiconductor nanocrystal may have a quantum yield of greater than or equal to about 10%, or greater than or equal to about 30%, for example, greater than or equal to about 50%, greater than or equal to about 60%, greater than or equal to about 70%, or greater than or equal to about 90%.

For use in display devices, the semiconductor nanocrystal may have a narrower FWHM so as to realize enhanced color purity or color reproducibility. The semiconductor nanocrystal may have a FWHM of less than or equal to about 45 nm, for example less than or equal to about 40 nm, or less than or equal to about 30 nm. While not wishing to be bound by theory, it is understood that within such ranges, a device including the nanocrystal may have enhanced color purity or improved color reproducibility.

The quantum dot (i.e., the semiconductor nanocrystal particle) may have a particle diameter (the longest diameter for a non-spherically shaped particle) of about 1 nm to about 100 nm. For example, the quantum dot may have a particle diameter (the longest diameter for a non-spherically shaped particle) of about 1 nm to about 20 nm, for example, from 2 nm (or from 3 nm) to 15 nm.

The quantum dot may have a generally-used shape in this art, and is not particularly limited. For example, the quantum dot may include spherical, pyramidal, multi-armed, or cubic nanoparticles, nanotubes, nanowires, nanofibers, nanoplate particles, a combination thereof, or the like.

The quantum dot is commercially available or may be synthesized in any method. For example, several nano-sized quantum dots may be synthesized according to a wet chemical process. In the wet chemical process, precursors react in an organic solvent to grow nanocrystal particles, and the organic solvent or a ligand compound may coordinate (or bound) to the surface of the semiconductor nanocrystal, thereby controlling the growth of the nanocrystal. Examples of the organic solvent and ligand compound are known. The organic solvent coordinated to the surface of the quantum dot may affect stability of a device, and thus excess organic materials that are not coordinated to the surface of the quantum dot may be removed by pouring the quantum dot into an excessive amount of a non-solvent, and centrifuging the resulting mixture. Examples of the non-solvent may be acetone, ethanol, methanol, and the like, but are not limited thereto. After the removal of extra organic materials, the amount of the organic materials coordinated to the surface of the quantum dots may be less than or equal to about 50% by weight, for example, less than or equal to about 30 wt %, less than or equal to about 20 wt %, or less than or equal to about 10 wt % based on the total weight of the quantum dots. The organic material may include a ligand compound, an organic solvent, or a combination thereof.

The quantum dot may have an organic ligand having a hydrophobic moiety bonded to the surface of the quantum dot. In an embodiment, the organic ligand having a hydrophobic moiety may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a C5 to C24 alkyl group, a C5 to C24 alkenyl group, or a C5 to C20 aryl group), a polymeric organic ligand, or a combination thereof.

Examples of the organic ligand compound bonded to the surface of the quantum dot may include:

thiol compounds such as methane thiol, ethane thiol, propane thiol, butane thiol, pentane thiol, hexane thiol, octane thiol, dodecane thiol, hexadecane thiol, octadecane thiol, or benzyl thiol;

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

phosphine compounds such as methyl phosphine, ethyl phosphine, propyl phosphine, butyl phosphine, pentyl phosphine, octyl phosphine, dioctyl phosphine, tributyl phosphine, or trioctyl phosphine;

phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide;

diphenyl phosphine, triphenyl phosphine, or oxide compounds thereof;

a C5 to C20 alkylphosphinic acid such as hexylphosphinic acid, octylphosphinic acid, dodecanephosphinic acid, tetradecanephosphinic acid, hexadecanephosphinic acid, or octadecane phosphinic acid;

and the like, but are not limited thereto.

The quantum dot may include the hydrophobic organic ligand alone or as a mixture of two or more.

An amount of the quantum dot including the organic ligand may be greater than or equal to about 1 percent by weight (wt %), for example, greater than or equal to about 5 wt %, or greater than or equal to about 10 wt %, based on the total amount of the composition. The amount of the quantum dot including the organic ligand may be less than or equal to about 40 wt %, for example, less than or equal to about 35 wt %, based on the total amount of the composition. In some embodiments, the amount of the quantum dot including the organic ligand may be about 5 wt % to 40 wt %, based on a total weight of solid contents (non-volatile components) of the compositions.

Using a photoluminescent type of color filter instead of the absorption type of color filter may widen the viewing angle and improve the luminance. The quantum dot may have a theoretical quantum yield (QY) of about 100%, and may emit light having high color purity (e.g., a full width at half maximum (FWHM) of less than or equal to about 40 nm), and thus it may achieve the enhanced luminous efficiency and the improved color reproducibility. Accordingly, it is believed that using a color filter including a quantum dot polymer composite may allow realizing a display having high brightness, a wide viewing angle, and high color reproducibility. In order to realize the aforementioned properties, however, it may be required to well-disperse a relatively large number of quantum dots (e.g., at least 5 wt % of the quantum dots based on the total amount of the composite) in the polymer composite.

Meanwhile, as a method of forming a pattern including quantum dots in conventional arts, U.S. Pat. No. 7,199,393 discloses that quantum dots having a photosensitive functional group on the surface thereof are used in a patterning method, the entire content of which is incorporated herein by reference. In the disclosed method, a photosensitive functional group is introduced onto the surface of a quantum dot and subjected to photopolymerization, if desired, together with a photopolymerizable monomer, to prepare a quantum dot-polymer composite pattern. But the disclosed method requires an additional process of a surface treatment of quantum dots and needs to use an organic solvent to form a pattern during a developing process.

On the other hand, when the quantum dots (e.g., in which organic ligand is bound to the surface) are mixed with the alkali-developable photoresist without performing any surface treatment in an attempt to provide an alkali-developable quantum dot-polymer composite pattern, they are not dispersed well or are even agglomerated because the quantum dots have poor compatibility with the conventional photoresist. In order for the patterned quantum dot-polymer composite to be applied in a color filter, a large amount of quantum dots should be able to be included in the composite. When the quantum dots cannot be dispersed in the composition, it becomes impossible to provide a uniform pattern.

In the photosensitive composition according to an embodiment, the quantum dot including an organic ligand (e.g., having a hydrophobic moiety) on the surface is first dispersed in the solution of the carboxylic acid group-containing binder having a hydrophobic moiety. The obtained quantum dot-binder dispersion is then mixed with the other components for a photoresist. As a results, the quantum dots may be well dispersed in the alkali-developable photoresist. Therefore, in case of the photosensitive composition according to an embodiment, a relatively large amount of the quantum dots may be well dispersed in the photoresist composition. Without wishing to be bound by any theory, it is understood that when the quantum dots are dispersed in the solution of the carboxylic acid group-containing binder having a hydrophobic moiety, the binder may facilitate the formation of the dispersion including the quantum dots, and the quantum dots dispersed with the help of the binder may maintain their dispersed state even when they constitute a photoresist composition.

Therefore, the photosensitive composition of the embodiments includes a quantum dot dispersion that includes a carboxylic acid group-containing binder and a plurality of the quantum dots dispersed (e.g., separated from one another) in the binder. The carboxylic acid group-containing binder may include a copolymer of a monomer combination including the first monomer having a carboxylic acid group and a carbon-carbon double bond and the second monomer having a carbon-carbon double bond and a hydrophobic moiety but including no carboxylic acid group.

As the photosensitive composition according to an embodiment may provide a quantum dot-polymer composite pattern including the quantum dot with no photo-polymerizable functional group (e.g., carbon-carbon double bond such as (meth)acrylate), no surface treatment for the quantum dot surface is necessary. In addition, a developing process for a pattern prepared from the aforementioned photosensitive composition does not require a use of an organic solvent such as toluene or NMP in the developing process.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer may include, but are not limited to:
  alkenyl aromatic compounds such as styrene, α-methyl styrene, vinyl toluene, or vinyl benzyl methyl ether;
  unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;
  unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;
  maleimides such as N-phenylmaleimide, N-benzylmaleimide, N-alkylmaleimide;
  unsaturated carboxylic acid glycidyl ester compounds such as glycidyl acrylate or glycidyl methacrylate;
  vinyl cyanide compounds such as acrylonitrile or methacrylonitrile; and
  unsaturated amide compounds such as acrylamide or methacrylamide,
  but are not limited thereto.

As the second monomer, at least one compound may be used.

The carboxylic acid group-containing binder may have an acid value of greater than or equal to about 50 milligrams of KOH per gram (mg KOH/g) in order to disperse quantum dots, but the acid value may vary depending on a chemical structure thereof (e.g., a chemical structure of a main chain or a hydrophobic moiety at the side chain). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The carboxylic acid group-containing binder may have an acid value of, for example, less than or equal to about 200 mg KOH/g, for example, less than or equal to about 190 mg KOH/g, less than or equal to about 180 mg KOH/g, or less than or equal to about 160 mg KOH/g, but it is not limited thereto. While not wishing to be bound by theory, it is understood that when the quantum dots are mixed with a solution of a binder having the acid value within the aforementioned range to provide a quantum dot-binder dispersion, the obtained quantum dot-binder dispersion may have the improved compatibility with the other components for the photoresist (e.g., photopolymerizable monomer, photoinitiator, solvent, etc.), and thereby the quantum dots may be well dispersed in the final composition (i.e., photoresist composition) to form a pattern. In an embodiment, the carboxylic acid group-containing binder may have an acid value of about 100 mg KOH/g to about 200 mg KOH/g.

The carboxylic acid group-containing binder may include a copolymer of a monomer combination that includes the first and second monomers, and may further include a third monomer having a carbon-carbon double bond and a hydrophilic moiety and not having a carboxylic acid group.

Examples of the third monomer may include 2-hydroxy ethyl acrylate, 2-hydroxy ethyl methacrylate, 2-hydroxy butyl acrylate, and 2-hydroxy butyl methacrylate, but are not limited thereto. The third monomer may include one or more compounds.

The first repeating unit may include a repeating unit represented by Chemical Formula 1-1, a repeating unit represented by Chemical Formula 1-2, or a combination thereof:

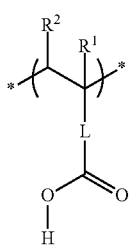

Chemical Formula 1-1 wherein
R$^1$ is hydrogen, a C1 to C3 alkyl group, or —(CH$_2$)$_{n1}$—COOH (wherein n1 is 0 to 2),
R$^2$ is hydrogen, a C1 to C3 alkyl group, or —COOH,
L is a single bond, a C1 to C15 aliphatic hydrocarbon group such as a C1 to C3 alkylene group, a C6 to C30 aromatic hydrocarbon group such as a C6 to C12 arylene group, a C6 to C30 alicyclic hydrocarbon group (a cycloalkylene group or a cycloalkenylene group such as a norbornene moiety, or a C1 to C15 aliphatic hydrocarbon group substituted with a C6 to C30 aromatic hydrocarbon group or a C6 to C30 alicyclic hydrocarbon group, and
* indicates a portion linked to an adjacent atom;

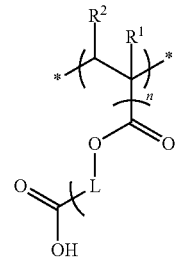

Chemical Formula 1-2 wherein
R$^1$ is hydrogen, a C1 to C3 alkyl group, or —(CH$_2$)$_{n1}$—COOH (wherein n1 is 0 to 2),
R$^2$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group (e.g., a cycloalkylene group or a cycloalkenylene group such as a norbornene moiety), or a C1 to C15 aliphatic hydrocarbon group substituted with a C6 to C30 aromatic hydrocarbon group or a C6 to C30 alicyclic hydrocarbon group,
n is an integer of 1 to 3, and
* indicates a portion linked to an adjacent atom.

The second repeating unit may include a repeating unit represented by Chemical Formula 2, a repeating unit represented by Chemical Formula 4, a repeating unit represented by Chemical Formula 5, a repeating unit represented by Chemical Formula A, or a combination thereof:

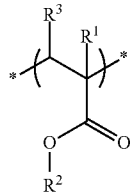

Chemical Formula 2 wherein
R$^1$ is hydrogen or a C1 to C3 alkyl group,
R$^2$ is a C1 to C15 aliphatic hydrocarbon group (e.g., a C1 to C15 alkyl group such as methyl, ethyl, propyl, and the like), a C6 to C30 aromatic hydrocarbon group (a C6 to C24 aryl group such as a phenyl group, a naphthyl group or the like), a C6 to C30 alicyclic hydrocarbon group such as a cycloalkyl group (e.g., a cyclohexyl group, a norbornyl group, or the like), or a C1 to C15 aliphatic hydrocarbon group substituted with a C6 to C30 aromatic hydrocarbon group or a C6 to C30 alicyclic hydrocarbon group (e.g., an arylalkyl group),
R$^3$ is hydrogen or a C1 to C3 alkyl group, and
* indicates a portion linked to an adjacent atom;

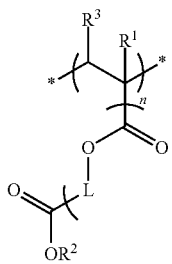

Chemical Formula 4 wherein $R^1$ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group (e.g., a cycloalkylene group or a cycloalkenylene group such as a norbornene moiety), or a C1 to C15 aliphatic hydrocarbon group substituted with a C6 to C30 aromatic hydrocarbon group or a C6 to C30 alicyclic hydrocarbon group, $R^2$ is a C1 to C15 aliphatic hydrocarbon group (e.g., a C1 to C15 alkyl group such as methyl, ethyl, propyl, and the like), a C6 to C30 aromatic hydrocarbon group (e.g., a C6 to C24 aryl group such as a phenyl group, a naphthyl group, or the like), a C6 to C30 alicyclic hydrocarbon group such as a cycloalkyl group (e.g., a cyclohexyl group), a norbornyl group, or the like, or a C1 to C15 aliphatic hydrocarbon group substituted with a C6 to C30 aromatic hydrocarbon group or a C6 to C30 alicyclic hydrocarbon group (e.g., an arylalkyl group), $R^3$ is hydrogen or a C1 to C3 alkyl group, n is an integer of 1 to 3, and

* indicates a portion linked to an adjacent atom;

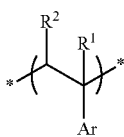

Chemical Formula 5 wherein each of $R^1$ and $R^2$ is independently hydrogen or a C1 to C3 alkyl group, Ar is a substituted or unsubstituted C6 to C30 aromatic hydrocarbon group (e.g., an aryl group such as phenyl and an arylalkyl group such as benzyl and the like), or a substituted or unsubstituted C6 to C30 alicyclic hydrocarbon group, and

* indicates a portion linked to an adjacent atom;

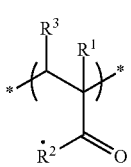

Chemical Formula A wherein $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group (for example, a cycloalkyl group or a cycloalkenyl group such as norbornene), or a C1 to C15 aliphatic hydrocarbon group substituted with a C6 to C30 aromatic hydrocarbon group or a C6 to C30 alicyclic hydrocarbon group, $R^3$ is hydrogen or a C1 to C3 alkyl group, and

* indicates a portion linked to an adjacent atom.

The copolymer may further include a third repeating unit derived from a third monomer, and the third repeating unit may be represented by Chemical Formula 3:

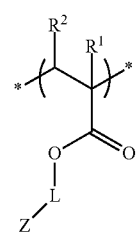

Chemical Formula 3 wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group such as a C6 to C30 arylene group, a C6 to C30 alicyclic hydrocarbon group (e.g., a cycloalkylene group or a cycloalkenylene group such as a norbornene moiety), or a C1 to C15 aliphatic hydrocarbon group substituted with a C6 to C30 aromatic hydrocarbon group or a C6 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

In an embodiment, the carboxylic acid group-containing binder may be a copolymer of (meth)acrylic acid (i.e., the first monomer) and at least one second or third monomer selected from arylalkyl(meth)acrylate, hydroxyalkyl (meth) acrylate, and styrene.

In the carboxylic acid group-containing binder, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the carboxylic acid group-containing binder, an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the carboxylic acid group-containing binder, an amount of the second repeating unit derived from the second monomer may be greater than or equal to about 10 mol %, for example, greater than or equal to about 15 mol %, greater than or equal to about 25 mol %, or greater than or equal to about 35 mol %. In the carboxylic acid group-containing binder, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

In the carboxylic acid group-containing binder, an amount of the third repeating unit derived from the third monomer may be greater than or equal to about 1 mol %, for example, greater than or equal to about 5 mol %, greater than or equal to about 10 mol %, or greater than or equal to about 15 mol %. In the carboxylic acid group-containing binder, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

The carboxylic acid group-containing binder may include a copolymer of a (meth)acrylic acid, and at least one monomer selected from an arylalkyl(meth)acrylate, a hydroxyalkyl (meth)acrylate, and styrene. For example, the carboxylic acid group-containing binder may include a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

In another embodiment, the carboxylic acid group-containing binder may include a multiple aromatic ring-containing polymer having a backbone structure where two aromatic rings are bound to a quaternary carbon atom that is a constituent atom of another cyclic moiety in the main chain and including a carboxylic acid group (—COOH) (for example, being bound to the main chain).

In the multiple aromatic ring-containing polymer, the backbone structure may include a repeating unit represented by Chemical Formula B:

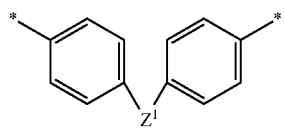

Chemical Formula B wherein
* indicates a portion that is linked to an adjacent atom of the main chain of the binder,
$Z^1$ is a linking moiety represented by any one of Chemical Formulae B-1 to B-6, and in Chemical Formulae B-1 to B-6,

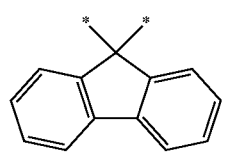

Chemical Formula B-1

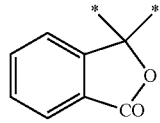

Chemical Formula B-2

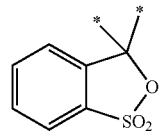

Chemical Formula B-3

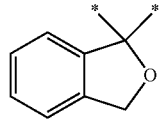

Chemical Formula B-4

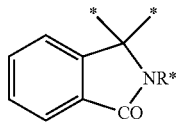

Chemical Formula B-5 wherein
$R^a$ is hydrogen, an ethyl group, $C_2H_4Cl$, $C_2H_4OH$, $CH_2CH=CH_2$, or a phenyl group,

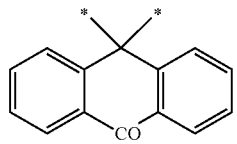

Chemical Formula B-6 wherein indicates a portion that is linked to an adjacent atom.

The multiple aromatic ring-containing polymer may include a repeating unit represented by Chemical Formula C:

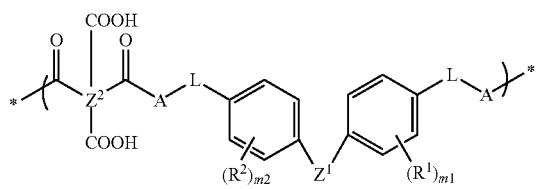

Chemical Formula C wherein
$Z^1$ is a linking moiety represented by any one of Chemical Formulae B-1 to B-6,
L is a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond,
A is —NH—, —O—, or a C1 to C10 alkylene,
each of $R^1$ and $R^2$ is independently hydrogen, a halogen, or a substituted or unsubstituted C1 to C20 alkyl group,
m1 and m2 are independently an integer ranging from 0 to 4,
$Z^2$ is a C6 to C40 aromatic organic group, and
each of * and *' indicate a portion that is linked to an adjacent atom.

In Chemical Formula C, $Z^2$ may be any one of Chemical Formula C-1, Chemical Formula C-2, and Chemical Formula C-3:

Chemical Formula C-1

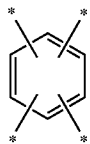

wherein * indicates a portion that is linked to an adjacent carbonyl carbon,

Chemical Formula C-2

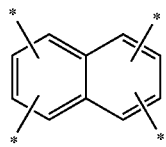

wherein * indicates a portion that is linked to an adjacent carbonyl carbon,

Chemical Formula C-3

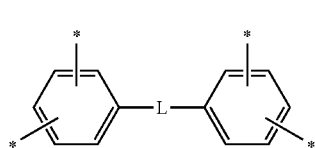

wherein
* indicates a portion that is linked to an adjacent carbonyl carbon,
L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula D:

Chemical Formula D

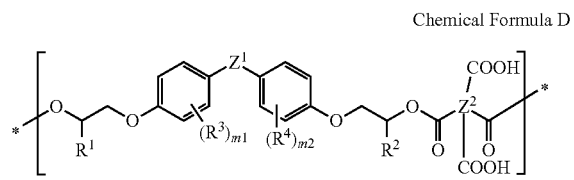

wherein
each of $R^1$ and $R^2$ is independently hydrogen or a substituted or unsubstituted (meth)acryloyloxyalkyl group,
each of $R^3$ and $R^4$ is independently hydrogen, a halogen, or a substituted or unsubstituted C1 to C20 alkyl group,
$Z^1$ is a moiety selected from linking moieties represented by Chemical Formulae B-1 to B-6,
$Z^2$ is an aromatic organic group such as the moieties set forth above,
m1 and m2 are independently an integer ranging from 0 to 4, and
* indicates a portion that is linked to an adjacent atom.

The multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrine to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as below:

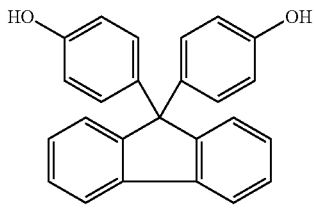

1) epichlorohydin (12 eq)
tetra methyl ammonium chloride (3 wt %)
sodium hydroxide (1.3 eq)
dimethyl sulfoxide 100° C., 6 h 2) aqueous sodium hydroxide (0.5 eq)
4-methyl-2-pentanone 100° C., 6 h

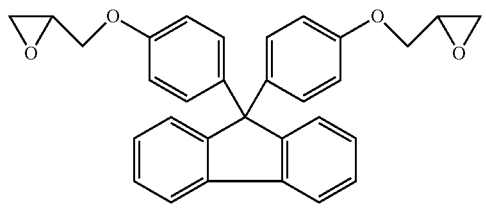

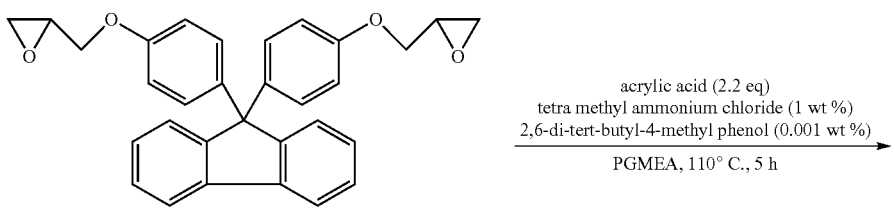

acrylic acid (2.2 eq)
tetra methyl ammonium chloride (1 wt %)
2,6-di-tert-butyl-4-methyl phenol (0.001 wt %)
PGMEA, 110° C., 5 h

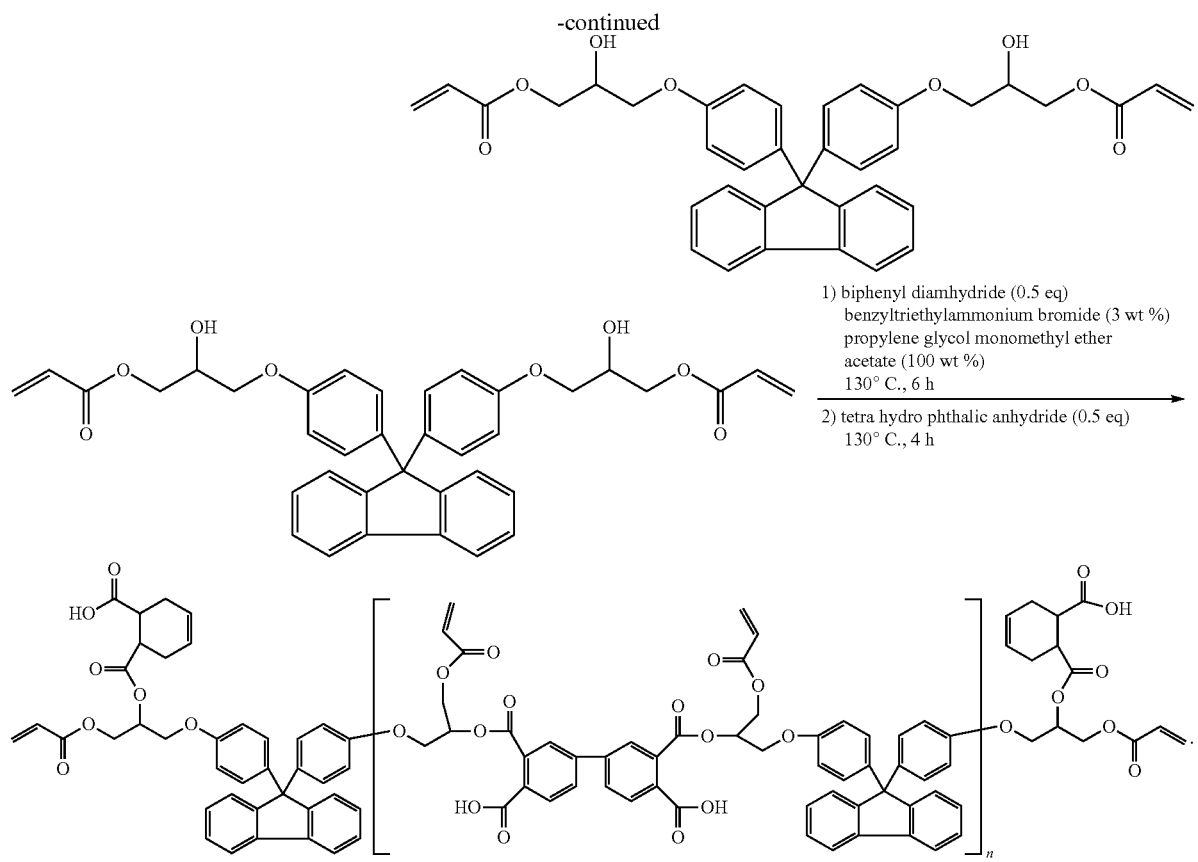

The multiple aromatic ring-containing polymer may include a functional group represented by Chemical Formula E at one or both terminal ends:

Chemical Formula E

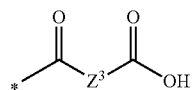

wherein

* indicates a portion that is linked to an adjacent atom, and
$Z^3$ is a moiety represented by one of Chemical Formulae E-1 to E-7:

Chemical Formula E-1

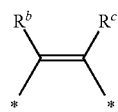

wherein
each of $R^b$ and $R^c$ is independently hydrogen, a substituted or unsubstituted C1 to C20 alkyl group, an ester group, or an ether group, and
* indicates a portion that is linked to an adjacent atom.

Chemical Formula E-2

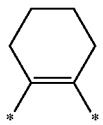

Chemical Formula E-3

Chemical Formula E-4

Chemical Formula E-5

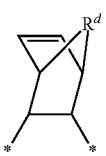

wherein $R^d$ is O, S, NH, a substituted or unsubstituted C1 to C20 alkylene group, a C1 to C20 alkylamine group, or a C2 to C20 alkenylamine group.

Chemical Formula E-6

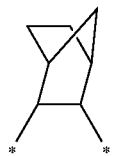

Chemical Formula E-7

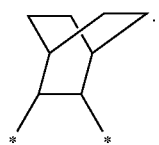

The multiple aromatic ring-containing polymer may be synthesized by a known method or is commercially available (e.g., from Nippon Steel Chemical Co., Ltd.).

As non-limiting examples, the multiple aromatic ring-containing polymer may include a reaction product of a fluorene compound selected from 9,9-bis(4-hydroxyphenyl)fluorene, 9,9-bis(4-aminophenyl)fluorene, 9,9-bis[4-(glycidyloxy)phenyl]fluorene, and 9,9-bis[4-(2-hydroxyethoxy)phenyl]fluorene with an appropriate compound capable of reacting with the fluorene compound (e.g., an aromatic dianhydride selected from 9,9-bis-(3,4-dicarboxyphenyl)fluorene dianhydride, pyromellitic dianhydride (PDMA), biphenyltetracarboxylic dianhydride (BPDA), benzophenone tetracarboxylic dianhydride, and naphthalene tetracarboxylic dianhydride, a C2 to C30 diol compound, epichlorohydrine, or the like). The fluorene compound, dianhydrides, a diol compound, and the like are commercially available, and the reaction conditions therebetween are known in the art.

The carboxylic acid group-containing binder may have a molecular weight of greater than or equal to about 1,000 g/mol, for example, greater than or equal to about 2,000 g/mol, greater than or equal to about 3,000 g/mol, or greater than or equal to about 5,000 g/mol. The carboxylic acid group-containing binder may have a molecular weight of less than or equal to about 100,000 g/mol, for example, less than or equal to about 50,000 g/mol. While not wishing to be bound by theory, it is understood that within the foregoing ranges, more improved developability may be ensured.

In the photosensitive composition, an amount of the carboxylic acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on the total weight of the composition. An amount of the carboxylic acid group-containing binder may be less than or equal to about 40 wt %, for example, less than or equal to about 30 wt % based on the total weight of the composition. In an embodiment, an amount of the carboxylic acid group-containing binder may be 5 to 40 wt % based on the total weight of solids (i.e., non-volatiles) of the composition. While not wishing to be bound by theory, it is understood that within the aforementioned range, appropriate developability and improved processability may be accomplished in a subsequent pattern forming process while ensuring dispersibility of the quantum dots.

A photosensitive composition of an embodiment includes a reactive compound having at least two thiol groups.

The reactive compound may have a structure of Chemical Formula 6:

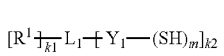

Chemical Formula 6 wherein $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are independently hydrogen or a C1 to C30 linear or branched alkyl group); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)ONRR' (wherein R and R' are independently hydrogen or a C1 to C20 linear or branched alkyl group), or a combination thereof, $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—$CH_2$—) of the substituted or unsubstituted C1 to C30 alkylene group may be replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The reactive compound may include a compound of Chemical Formula 6-1:

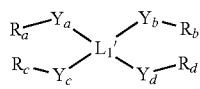

Chemical Formula 6-1 wherein
- $L_1'$ is carbon, a substituted or unsubstituted C2 to C20 group derived from an alkane, a substituted or unsubstituted C6 to C30 group derived from an arene, a substituted or unsubstituted C3 to C30 group derived from a heteroarene, a substituted or unsubstituted C3 to C30 group derived from a cycloalkane, or a substituted or unsubstituted C3 to C30 group derived from a heterocycloalkane,
- $Y_a$ to $Y_d$ are independently a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and
- each of $R_a$ to $R_d$ is independently $R^1$ of Chemical Formula 1 or SH, provided that at least two of them are SH.

The reactive compound may react with a photopolymerizable monomer (which will be described in detail below) without an adverse effect on the dispersion of quantum dots, and thereby prevent the heat treatment (e.g., post-baking), which is accompanied by the photoresist process, from deteriorating the luminous efficiency of the quantum dots dispersed in the pattern. Without wishing to be bound by any theory, it is believed that the reactive compound may allow the polymer to form a denser network by further reacting with the photopolymerizable monomer described later. In addition, the reactive compound may provide a bond between the quantum dots and the photopolymerizable monomers to ensure the dispersion and the stability of the quantum dots in the composite. A pattern formed from the photosensitive resin composition including the reactive compound may enhance the light emitting properties (such as a property of maintaining the blue-light conversion rate), for example, by at least about 2 times in comparison with the composite without the reactive compound. In some embodiments, the photosensitive composition may maintain a blue light conversion rate of greater than or equal to about 40% of the initial value when it is developed by an alkali aqueous solution and then dried and heated at 180° C. for 30 min.

The reactive compound may include a dithiol compound, a trithiol compound, a tetrathiol compound, or a combination thereof. For example, the reactive compound may include glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof. In the photosensitive composition, an amount of the reactive compound may be greater than or equal to about 0.1 wt %, for example, greater than or equal to about 0.5 wt %, or greater than or equal to about 1 wt % based on the total weight of the composition. The amount of the reactive compound may be less than or equal to about 40 wt %, for example, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 10 wt %, less than or equal to about 9 wt %, less than or equal to about 8 wt %, less than or equal to about 7 wt %, less than or equal to about 6 wt %, less than or equal to about 5 wt % based on the total weight of the composition.

The photosensitive composition according to an embodiment includes a photopolymerizable monomer having at least one (e.g., two, three, four, five, six, or more) carbon-carbon double bond (e.g., an acrylate group or a methacrylate group). Types of the photopolymerizable monomer are not particularly limited as long as they include a carbon-carbon double bond and may be polymerized by light. For example, the photopolymerizable monomer may be a monomer or an oligomer that may be used in a photosensitive composition. The photopolymerizable monomer may include a monofunctional or multi-functional ester of (meth) acrylic acid having at least one ethylenic unsaturated double bond. For example, the photopolymerizable monomer may include a vinyl monomer, an unsaturated ethylenic oligomer, a homopolymer thereof, a copolymer of the unsaturated ethylenic oligomer and an ethylenic unsaturated monomer, or a combination thereof. Examples of the photopolymerizable monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth) acrylate, neopentyl glycol di(meth)acrylate, pentaerythritol di(meth)acrylate, pentaerythritol tri(meth)acrylate, pentaerythritol tetra(meth)acrylate, dipentaerythritol di(meth) acrylate, dipentaerythritol tri(meth)acrylate, dipentaerythritol penta(meth)acrylate, dipentaerythritol hexa(meth) acrylate, bisphenol A epoxyacrylate, bisphenol A di(meth) acrylate, trimethylolpropane tri(meth)acrylate, ethylene glycol monomethyl ether (meth)acrylate, novolacepoxy (meth)acrylate, diethylene glycol di(meth)acrylate, triethylene glycol di(meth)acrylate, propylene glycol di(meth)acrylate, tris(meth)acryloyloxyethyl phosphate, and the like. The photopolymerizable monomer of the embodiments may include a di(meth)acrylate compound, a tri(meth)acrylate compound, a tetra(meth)acrylate compound, a penta(meth) acrylate compound, a hexa(meth) acrylate compound, or a combination thereof.

In the photosensitive composition, the amount of the photopolymerizable monomer may be greater than or equal to about 0.5 wt %, for example, greater than or equal to about 1 wt %, or greater than or equal to about 2 wt % with respect to a total amount of the composition. The amount of the photopolymerizable monomer may be less than or equal to about 30 wt %, for example less than or equal to about 25 wt %, less than or equal to about 20 wt %, the amount of the photopolymerizable monomer may be 10 wt % with respect to a total amount of the composition.

The photosensitive composition may include a photopolymerization initiator. Types of the photopolymerization initiator are not particularly limited, and may be selected appropriately. For example, the available photopolymerization initiator may include a triazine compound, an acetophenone compound, a benzophenone compound, a thioxanthone compound, a benzoin compound, an oxime compound, or a combination thereof, but it is not limited thereto.

Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-trichloromethyl (piperonyl)-6-triazine, and 2,4-trichloromethyl (4'-methoxy styryl)-6-triazine, but are not limited thereto.

Examples of the acetophenone compound may be 2,2'-diethoxyacetophenone, 2,2'-dibutoxyacetophenone, 2-hydroxy-2-methylpropiophenone, p-t-butyltrichloroacetophenone, p-t-butyldichloro acetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound may be benzophenone, benzoyl benzoate, benzoyl methyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, and the like, but are not limited thereto.

The photopolymerization initiator may also be a carbazole compound, a diketone compound, a sulfonium borate compound, a diazo compound, a di-imidazole compound, and the like, in addition to the photopolymerization initiators.

In the photosensitive composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In an embodiment, the amount of the photoinitiator may be about 0.05 to about 10 wt % based on the total weight of solids (i.e., non-volatiles) of the composition. While not wishing to be bound by theory, it is understood that within the aforementioned ranges, a desirable pattern may be formed.

If desired, the photosensitive composition may further include various additives such as a light diffusing agent, a leveling agent, or a coupling agent in addition to the aforementioned components. The amount of the additive is not particularly limited, and may be selected within an appropriate range wherein the additive does not cause an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film, and examples thereof may include the following but are not limited thereto.

A fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

Types and amounts of the additives may be adjusted as necessary.

The coupling agent is aimed to increase adherence with respect to the substrate and examples thereof may include a silane-containing coupling agent. Examples of the silane-containing coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxylpropyltrimethoxysilane, 3-mercaptopropyltrimethoxysilane, and the like.

The photosensitive composition may include a solvent. The solvent may be included in the quantum dot dispersion. An amount of the solvent may be determined depending on the amounts of the above main components (i.e., the organic ligand-containing quantum dots, the COOH group-containing binder, the photopolymerizable monomer combination, and the photoinitiator), and additives. The composition may include the solvent in such an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives), its affinity for the alkali developing solution, and its boiling point. Examples of the solvent may be:

ethyl 3-ethoxy propionate;
an ethylene glycol such as ethylene glycol, diethylene glycol, or polyethylene glycol;
a glycol ether such as ethylene glycol monomethyl ether, ethylene glycol monoethyl ether, diethylene glycol monomethyl ether, ethylene glycol diethyl ether, and diethylene glycol dimethyl ether;
glycol ether acetates such as ethylene glycol acetate, ethylene glycol monoethyl ether acetate, diethylene glycol monoethyl ether acetate, and diethylene glycol monobutyl ether acetate;
a propylene glycol such as propylene glycol; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether;

propylene glycol ether acetates such as propylene glycol monomethyl ether acetate and dipropylene glycol monoethyl ether acetate;

amides such as N-methylpyrrolidone, dimethyl formamide, and dimethyl acetamide;

ketones such as methyl ethyl ketone (MEK), methyl isobutyl ketone (MIBK), and cyclohexanone;

petroleum products such as toluene, xylene, and solvent naphtha;

esters such as ethyl acetate, butyl acetate, and ethyl lactate;

ethers such as diethyl ether, dipropyl ether, and dibutyl ether; and any combinations thereof.

A method of preparing a photosensitive composition according to an embodiment includes:

dissolving the COOH containing binder in the solvent to prepare a binder solution;

dispersing a plurality of quantum dots having an organic ligand bound to a surface thereof in the binder solution to obtain a quantum dot-binder dispersion; and combining the quantum dot-binder dispersion with at least one selected from a reactive compound, a photoinitiator, a photopolymerizable monomer, and a solvent.

A combining manner is not particularly limited, and may be appropriately selected. For example, each component may be combined sequentially or simultaneously.

The method may further include selecting quantum dots including an organic ligand bonded to the surface, and selecting a binder capable of dispersing the quantum dots (e.g., a carboxylic acid group-containing binder). In the step of selecting the binder, the binder may be a carboxylic acid group-containing binder. The carboxylic acid group-containing binder may be a copolymer of a monomer combination including a first monomer having a carboxylic acid group and a carbon-carbon double bond and a second monomer having a carbon-carbon double bond and a hydrophobic moiety and not having a carboxylic acid group. A chemical structure and an acid value of the copolymer may be considered in this step.

Details of the quantum dots, the carboxylic acid group-containing binder, the photopolymerizable monomer, the photoinitiator, and the quantum dot dispersion are the same as set forth above.

The photosensitive composition may be developable with an alkaline aqueous solution, and thus a quantum dot-polymer composite pattern may be patterned from the photosensitive composition without using an organic solvent developing solution.

A non-limiting method of forming a pattern is explained referring to FIG. 1.

First, the photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of 3 to 30 micrometers, μm). The formed film may be pre-baked, if desired. The specific conditions of pre-baking such as temperature, time, and atmosphere are known in the art and may be appropriately selected.

The formed (or optionally, pre-baked) film is exposed to light of a predetermined wavelength under a mask having a predetermined pattern. The wavelength and the intensity of light may be selected depending on the types and the amounts of the photoinitiator, the types and the amounts of quantum dots, or the like.

The exposed film is treated with an alkali developing solution, and thereby the unexposed region in the film is dissolved to provide a desirable pattern. The obtained pattern may be post-baked, if desired, to improve crack resistance and solvent resistance of the pattern, for example, at a temperature of about 150° C. to about 230° C. for a predetermined time (e.g., greater than or equal to about 10 min or greater than or equal to about 20 min). Even after the performing of the post-bake process, the pattern obtained from the photosensitive composition may show improved thermal stability, so that the light conversion rate may be maintained at 30% or higher (e.g., 40% or higher) of the initial value.

When a quantum dot-polymer composite obtained from the photosensitive composition is used as a color filter, two or three types of photosensitive compositions each including red quantum dots, green quantum dots, (or optionally, blue quantum dots) are prepared, and the patterning process is repeated as many times as necessary (e.g., two times or three times) for each composition to provide a quantum dot-polymer composite having a desirable pattern.

Another embodiment provides a quantum dot-polymer composite, which includes:

a matrix including a carboxylic acid group (—COOH)-containing polymer and a polymerization product of a photopolymerizable monomer having a carbon-carbon double bond and a reactive compound having at least two thiol groups; and a plurality of quantum dots;

wherein the COOH-containing polymer includes a copolymer of a monomer combination including a first monomer having a carboxylic acid group and a carbon-carbon double bond and a second monomer having a carbon-carbon double bond and a hydrophobic moiety and not having a carboxylic acid group; and the plurality of quantum dots are dispersed (e.g., separated from one another) in the matrix (e.g., without agglomeration).

The composite may be a pattern. The quantum dot may include an organic ligand bound to a surface thereof.

Details of the quantum dots, the binder, the photopolymerizable monomer, and the like are the same as set forth above. The copolymer may be a linear polymer. The photopolymerizable monomer may include a monomer having at least three (meth)acrylate groups and the polymerization product may include a crosslinked polymer.

In some embodiments, a color filter includes the quantum dot-polymer composite or a pattern thereof. In another embodiment, a display device includes the quantum dot-polymer composite or a pattern thereof. The display device may be a liquid crystal display device.

Figure 13:
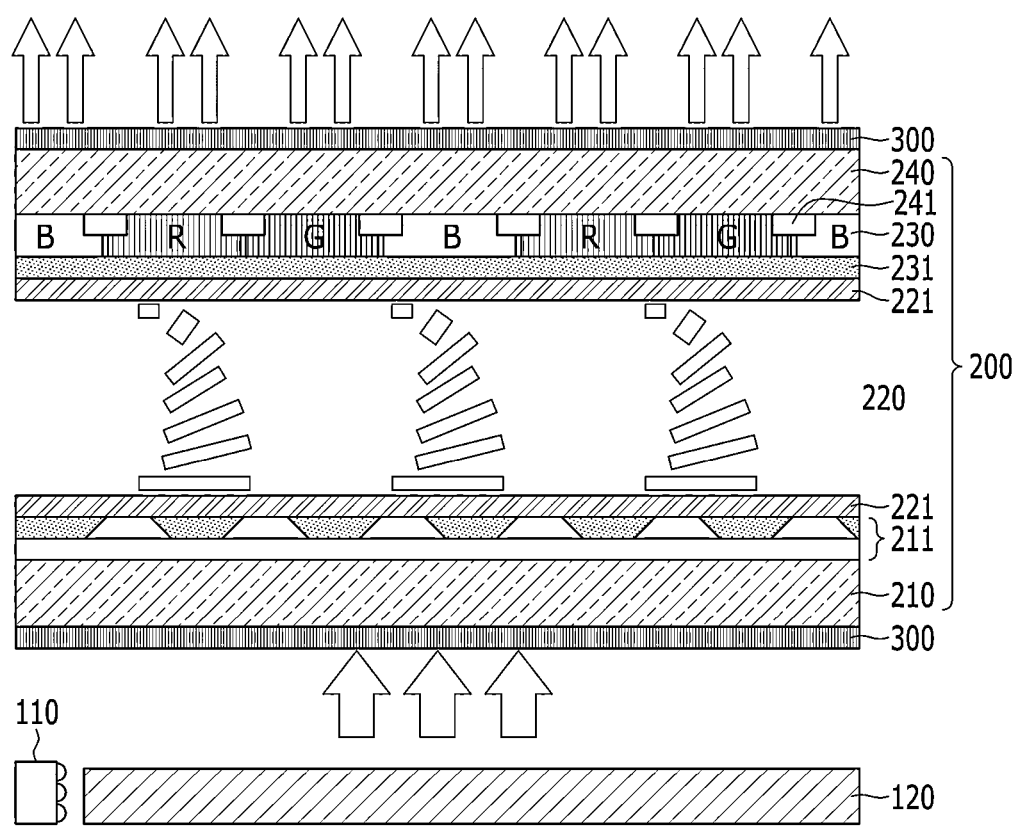
FIG. 13 is a schematic illustration of a cross-section of a display device according to a non-limiting embodiment.
Figure 14:
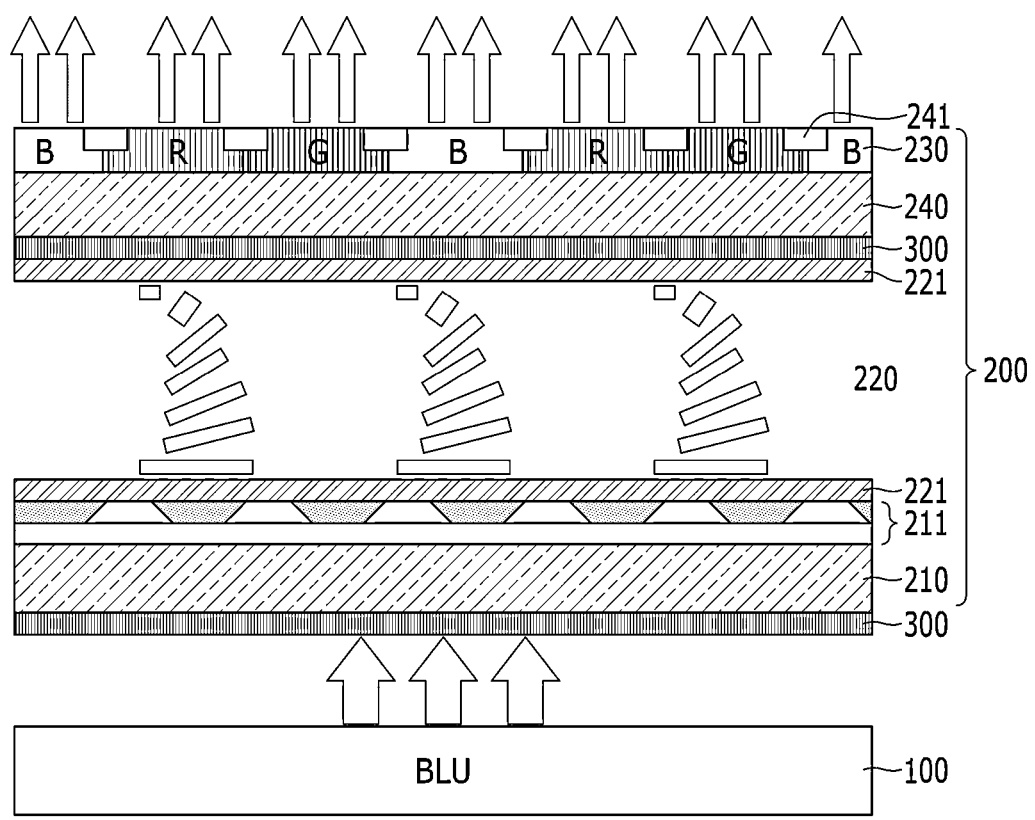
FIG. 14 is a schematic illustration of a cross-section of a display device according to a non-limiting embodiment.

Referring to FIG. 13 and FIG. 14, in a non-limiting embodiment, the liquid crystal display includes: a liquid crystal panel 200, an optical element 300 (e.g., a polarizing plate) that is disposed on and/or below the liquid crystal panel 200, and a back light unit that is disposed below the lower optical element 300 and includes a blue light emitting source. The liquid crystal panel 200 may include a lower substrate 210, an upper substrate 240, a liquid crystal layer 220 interposed between the upper and the lower substrates. The device include a color filter 230 disposed on a top surface or a bottom surface of the upper substrate 240. The color filter includes the aforementioned quantum dot-polymer composite or a pattern thereof.

The back light unit may include a light source 110 and optionally a light guide panel 120.

A wire plate 211 is disposed on an internal surface, e.g., a top surface, of the lower substrate 210. The wire plate 211 may include a plurality of gate wires (not shown) and data wires (not shown), a thin film transistor disposed adjacent to a crossing region of gate wires and data wires, and a pixel electrode for each pixel area, but is not limited thereto. In an embodiment, for example, pixel areas may be defined by the gate and data wires. The wire plate may have any structure or feature well-known in the art, and are not particularly limited.

The liquid crystal layer 220 may be disposed on the wire plate 211. The liquid crystal layer 220 may include alignment layers 221 on and under the layer 220 to initially align the liquid crystal material included therein. The liquid crystal material and the alignment layer may have any structure or feature well-known in the art (e.g., liquid crystal material, alignment layer material, method of forming liquid crystal layer, thickness of liquid crystal layer, or the like) and are not particularly limited.

The optical element 300 may be a member for maintaining polarization of light emitted from the photoluminescent color filter layer. In an embodiment, for example, the optical element 300 may be a polarizer. A black matrix 241 having an opening defined therethrough is disposed on the upper substrate 240, e.g., the bottom surface of the upper substrate 240, to cover a thin film transistor and a gate line, a data line, or the like of the wire plate disposed on the lower substrate 210. A photoluminescent color filter layer 230 including a first color filter (R) for emitting red light, a second color filter (G) for emitting green light, and/or a third color filter (B) for (emitting or transmitting) blue light may be disposed on the black matrix 241 and in the opening of the black matrix 241. In an exemplary embodiment, the black matrix 241 may have a lattice shape. A transparent common electrode 231 may be disposed on the photoluminescent color filter layer.

A liquid crystal display (hereinafter, LCD) is a display in which polarized light passes through a liquid crystal and then an absorption-type color filter to express a color. The LCD often has drawbacks such as a narrow viewing angle and low luminance due to a low level of light transmittance of the absorption-type color filter. For example, in the conventional LCD including the absorption-type color filter, the light (e.g. the white light) provided from the back light unit passes through the color filter to provide red, green, and blue light, and thus the intensity of light is inevitably decreased by one third. In contrast, in the display of the embodiments, the blue light from the back light unit passes through the color filter to provide light having a desired color without the aforementioned light loss occurring in the conventional LCD including the absorption-type color filter. Therefore, the display of the embodiments may show a luminance efficiency that is at least about three times greater than that of that conventional LCD. In addition, as the display of the embodiments includes the photoluminescent color filter, it may emit light at substantially the same intensity in all directions, allowing a wider viewing angle.

Hereinafter, the embodiments are illustrated in more detail with reference to examples. However, the present disclosure is not limited thereto.

EXAMPLES

Example 1

[1] Preparation of Quantum Dot-Binder Dispersion

A chloroform dispersion of red light emitting or green light emitting quantum dots (InP/ZnS) including oleic acid as a hydrophobic organic ligand bonded to a surface thereof is prepared.

The chloroform dispersion including 50 grams (g) of quantum dots (red) including oleic acid as a hydrophobic organic ligand bonded to a surface thereof is mixed with 100 g of a binder (a four membered copolymer of methacrylic acid, benzyl methacrylate, hydroxyethyl methacrylate, and styrene, acid value: 130 milligrams (mg) per gram of KOH (mg KOH/g), molecular weight: 8,000, acrylic acid:benzyl methacrylate:hydroxyethyl methacrylate:styrene (molar ratio)=61.5%:12%:16.3%:10.2%) solution (polypropylene glycol monomethyl ether acetate having a concentration of 30 percent by weight, wt %) to provide a quantum dot-binder dispersion.

Figure 2:
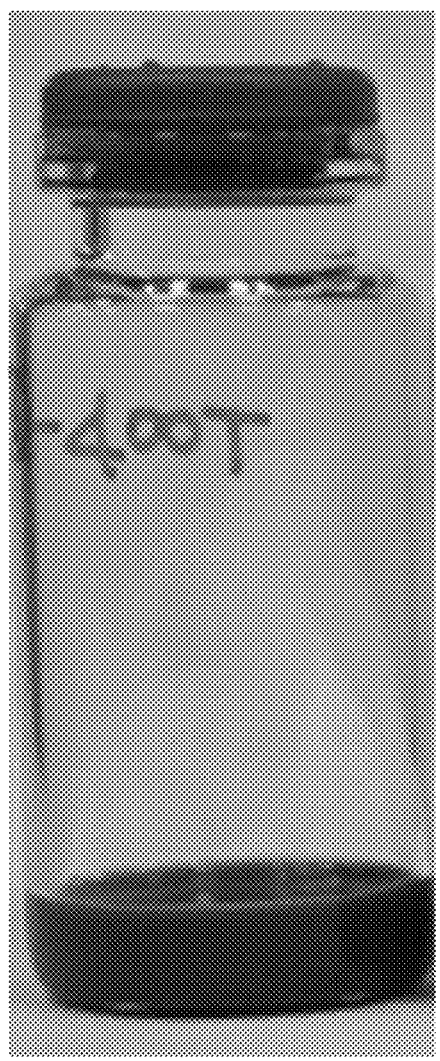
FIG. 2 is a photographic image showing a quantum dot-binder dispersion prepared in Example 1.

A photographic image of the dispersion thus prepared is shown in FIG. 2. FIG. 2 confirms that quantum dots are uniformly dispersed in the quantum dot-binder dispersion.

[2] Preparation of the Photosensitive Composition

To the quantum dot-binder dispersion, 10 g of glycol di-3-mercaptopropionate (hereinafter, 2T) having the following structure, 100 g of hexaacrylate having the following structure (as a photopolymerizable monomer), 1 g of an oxime ester compound (as an initiator), 30 g of $TiO_2$ (as a light diffusing agent), and 300 g of PGMEA (as a solvent) are added to obtain a photosensitive composition.

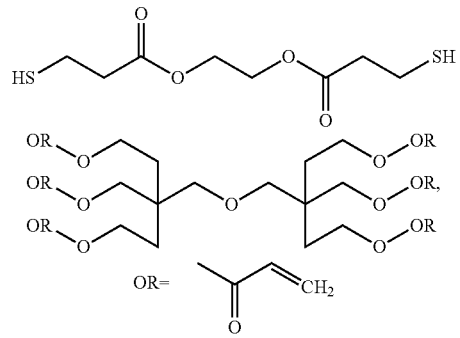

It is confirmed that the photosensitive composition thus prepared may form a dispersion without showing any noticeable agglomeration due to the addition of the quantum dots.

[3] Formation of Quantum Dot-Polymer Composite Pattern

The photosensitive composition obtained from item [2] is spin-coated on a glass substrate at 150 revolutions per minute (rpm) for 5 seconds (s) to provide a film. The obtained film is pre-baked at 100° C. for 2 minutes (min). The pre-baked film is irradiated with light (wavelength: 365 nanometers (nm), intensity: 60 millijoules, mJ) for 1 s under a mask having a predetermined pattern and developed by a potassium hydroxide-diluted aqueous solution (concentration: 0.043%) for 50 s to provide a pattern.

Figure 3:
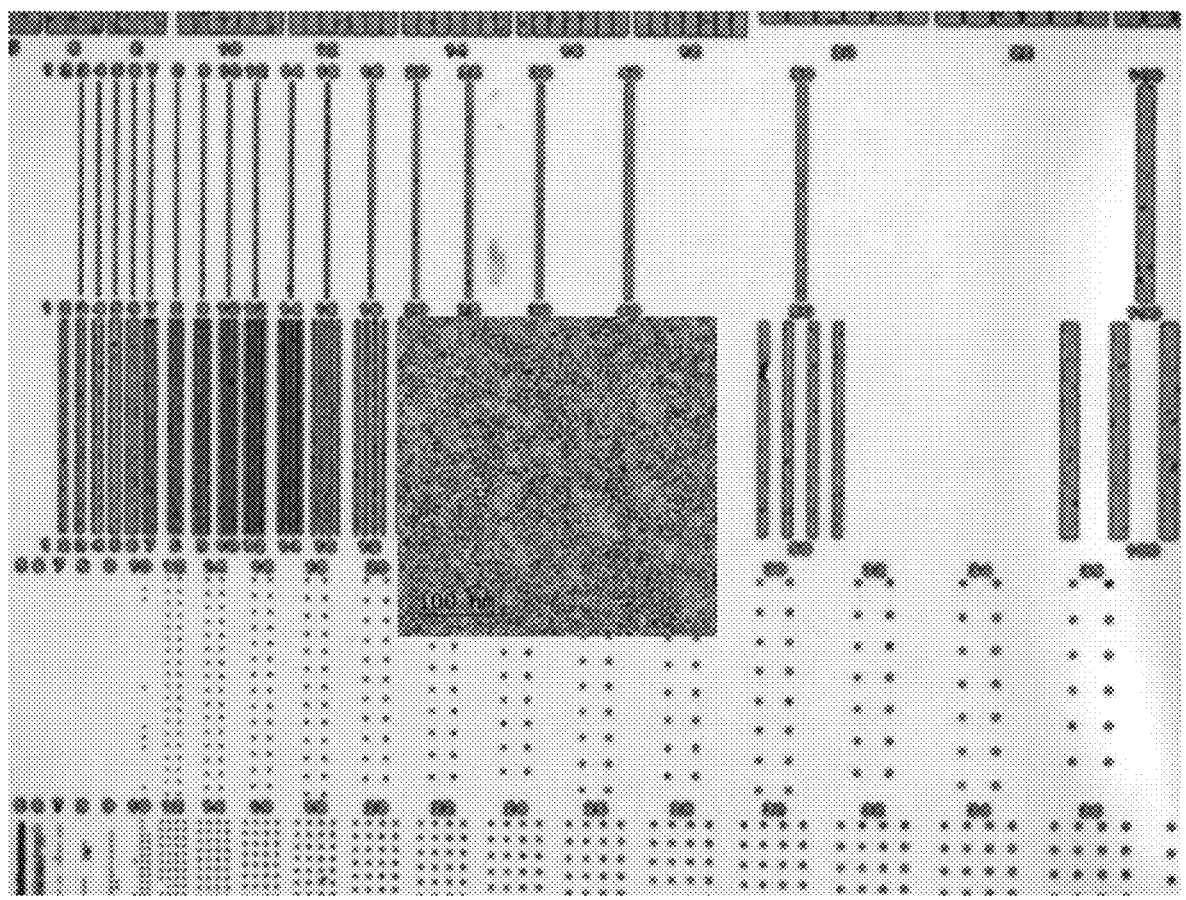
FIG. 3 is an optical microscope photograph of the quantum dot-polymer composite pattern prepared in Example 1.
Figure 4:
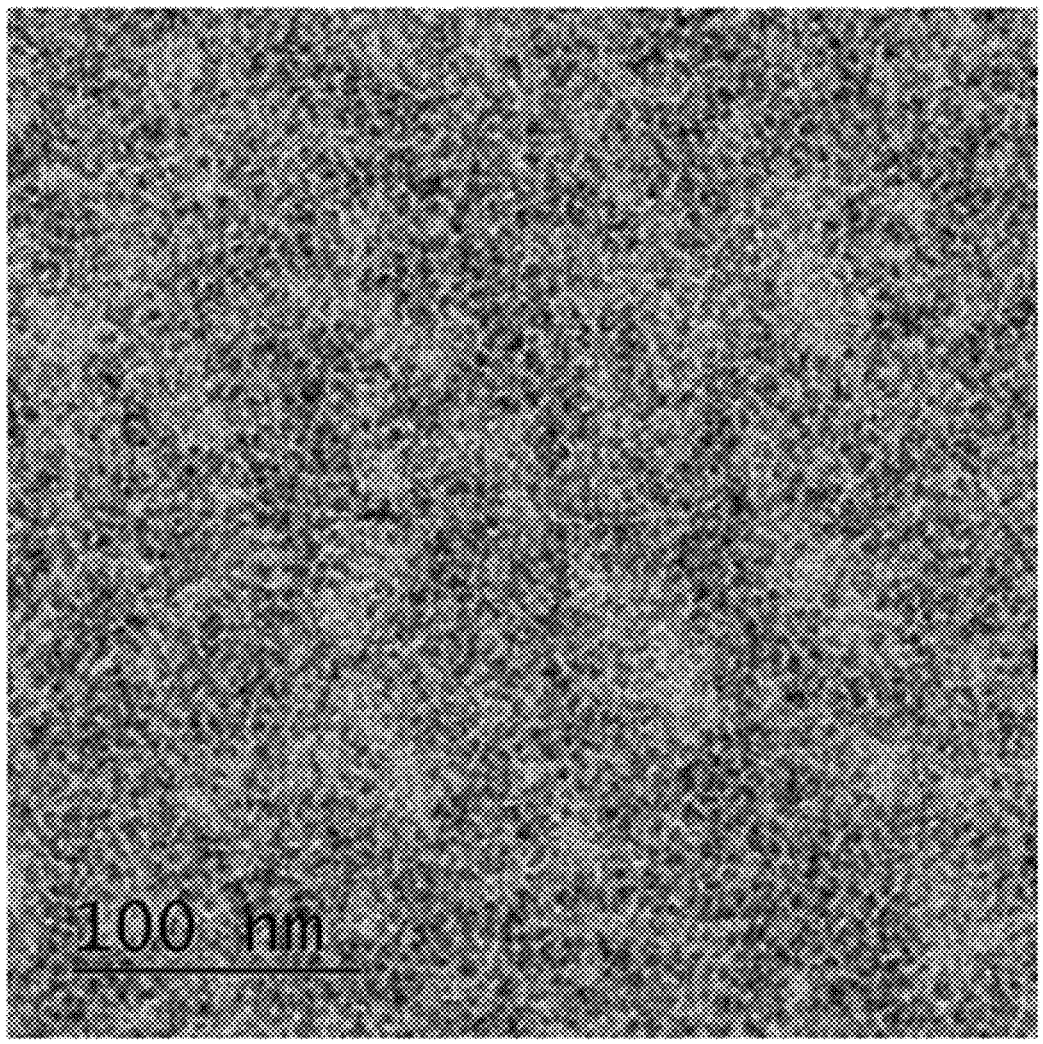
FIG. 4 is an electron-microscopic image showing quantum dots dispersed in the pattern prepared in Example 1.
Figure 11:
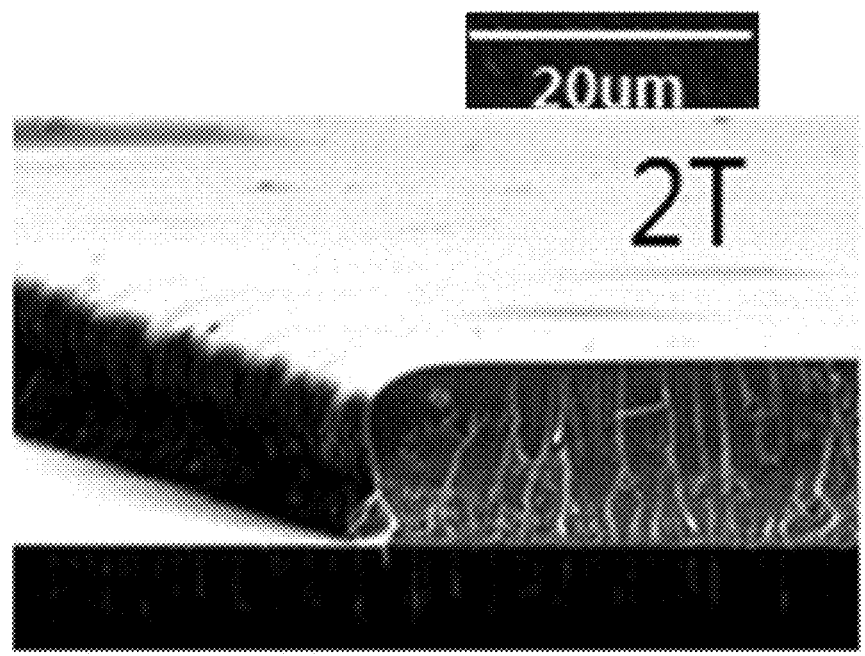
FIG. 11 is a view showing a cross-sectional image of the pattern prepared in Example 1.

An optical microscope image of the obtained pattern is shown in FIG. 3, and a photographic image of the cross-section of the obtained pattern is shown in FIG. 11.

The results of FIG. 3 confirm that the composition of Example 1 may form a pattern (line width: 100 micrometers, um) including quantum dots dispersed in a polymer. When the obtained pattern is irradiated with blue light (wavelength: 450 nm), red light is emitted from the pattern.

[4] Luminous Stability Test after the Post-Bake Treatment

The obtained pattern is subjected to 30 min of heating at 180° C. three times. For each time, the blue light conversion rate is measured and the results are compiled in Table 1.

Example 2

A photosensitive composition is prepared to form a pattern in accordance with the same procedure as in Example 1, except that trimethylolpropane tris(3-mercaptopropionate) (3T) having the following structure is used, and the blue light conversion rate of the obtained pattern is measured and the results are compiled in Table 1.

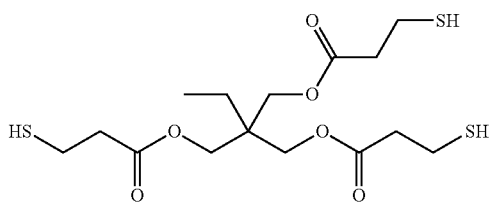 [SMILES: CCC(COC(=O)CCS)(COC(=O)CCS)COC(=O)CCS]

Example 3

A photosensitive composition is prepared to form a pattern in accordance with the same procedure as in Example 1, except that pentaerythritol tetrakis(3-mercaptopropionate) (4T) having the following structure is used, and the blue light conversion rate of the obtained pattern is measured and the results are compiled in Table 1.

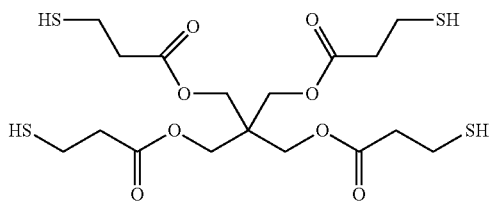 [SMILES: O=C(CCS)OCC(COC(=O)CCS)(COC(=O)CCS)COC(=O)CCS]

Example 4

A photosensitive composition is prepared to form a pattern in accordance with the same procedure as in Example 1, except that pentaerythritol tetrakis(2-mercaptopropionate) (PE-TSA) having the following structure is used, and the blue light conversion rate of the obtained pattern is measured and the results are compiled in Table 1.

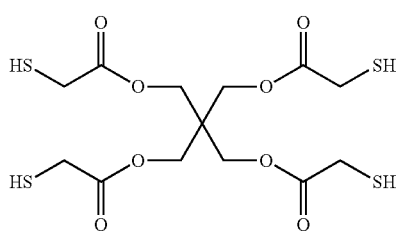 [SMILES: O=C(CS)OCC(COC(=O)CS)(COC(=O)CS)COC(=O)CS]

Comparative Example 1

Figure 5:
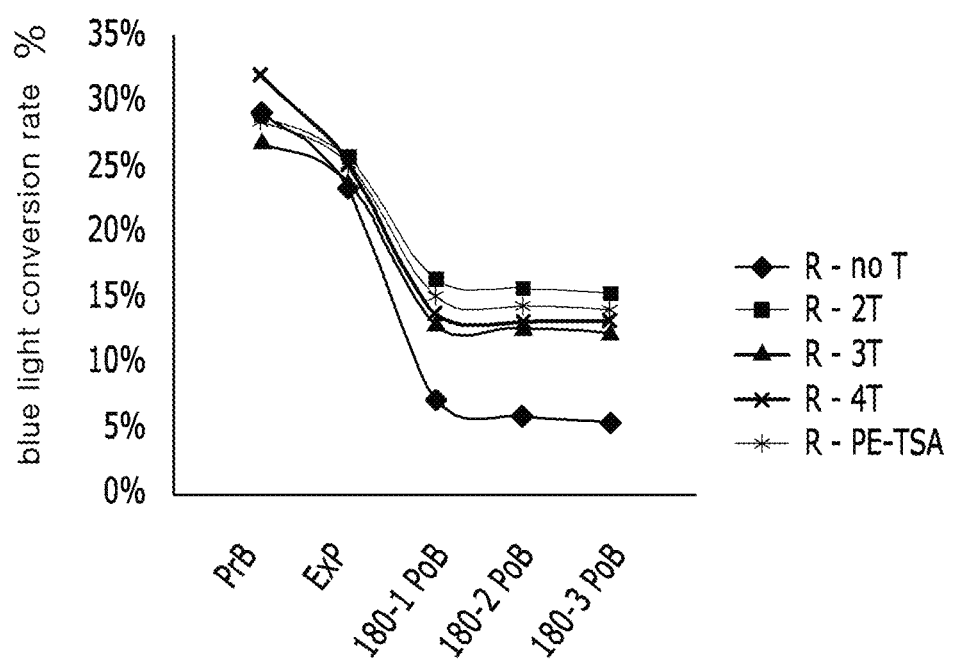
FIG. 5 is a view showing graphs plotting blue light conversion rate (percent, %) versus heat treating times (i.e., a process maintenance rate) with respect to the quantum dot-polymer composite patterns prepared in Examples 1 to 4 and Comparative Example 3, respectively.

A photosensitive composition is prepared to form a pattern in accordance with the same procedure as in Example 1, except that no reactive compound is used and the blue light conversion rate of the obtained pattern is measured, and the results are compiled in Table 1 and FIG. 5.

TABLE 1

| | Blue light conversion rate (%) | | | | | |
| --- | --- | --- | --- | --- | --- | --- |
| | Prebake (PrB) | Exposure & development (ExP) | First post bake (PoB) | Second PoB | Third PoB | Ratio of maintaining the initial blue light conversion rate |
| Example 1 | 27.1 | 24.6 | 15 | 14.6 | 13.9 | 53.1 |
| Example 2 | 25 | 22.4 | 13.1 | 11.9 | 11.9 | 46.1 |
| Example 3 | 30.9 | 24.7 | 14.7 | 13.8 | 13 | 41.6 |
| Example 4 | 26.7 | 23.4 | 14.4 | 13.7 | 13.3 | 49.5 |
| Comparative Example 1 | 24.9 | 21.3 | 7.7 | 6.7 | 5.5 | 18.7 |

The results of Table 1 confirm that the quantum dot-polymer patterns of Examples 1 to 4 may maintain its blue light conversion rate at least 30% (for example at least 40% or higher) of the initial blue light conversion rate after three times of heating at a temperature of 180° C.

Comparative Example 2

100 g of the same binder solution as in Example 1, 100 g of the same photopolymerizable monomer as in Example 1 (a hexaacrylate compound), 1 g of the same photoinitiator as in Example 1, 10 g of glycol di-3-mercaptopropionate (hereinafter, 2T), and 300 g of PGMEA are mixed to prepare a mixture.

To the obtained mixture, the same chloroform solution of the quantum dots as in Example 1 is added to prepare a photosensitive composition.

Figure 6:
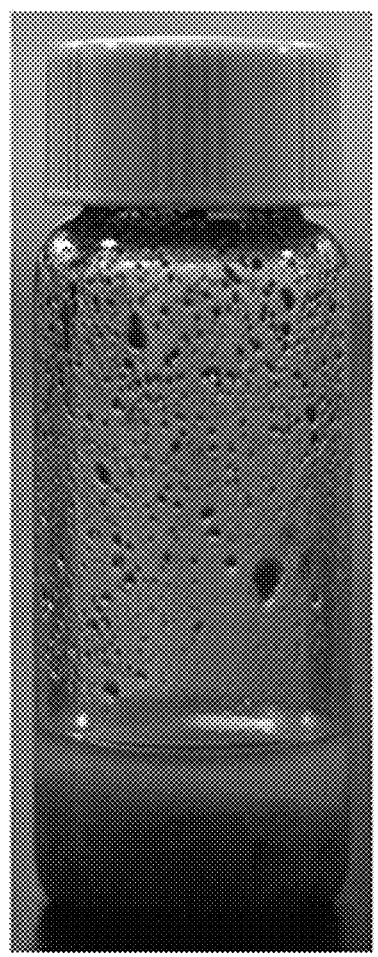
FIG. 6 is a photographic image showing a mixture of the quantum dot composition prepared in Comparative Example 2.

The photographic image of the obtained photosensitive composition is shown in FIG. 6. The results of FIG. 6 confirm that when the same quantum dot solution as in Example 1 is mixed with the same amount and the same type of binder, photopolymerizable monomer, photoinitiator, and solvent as in Example 1, the agglomeration of the quantum dots is significant, and thus a composition including the quantum dots dispersed therein cannot be obtained.

Comparative Example 3

A photosensitive composition is prepared to form a pattern in accordance with the same procedure as in Example 1, except that 100 g of the binder solution (concentration 30 wt %, polypropylene glycol monomethyl ether acetate) includes a binder resin having the same repeating units and an acid value of 30 mg KOH/g, and no reactive compound is used.

Figure 7:
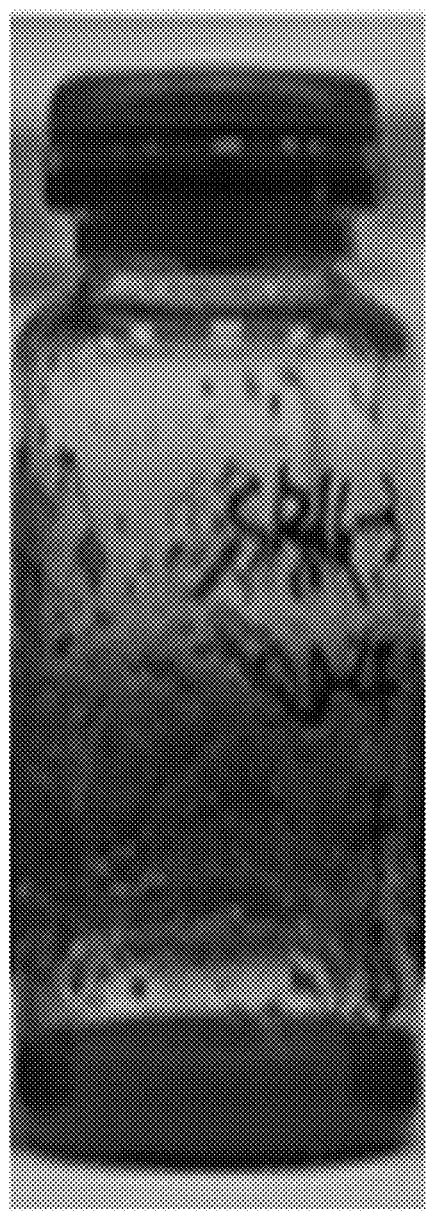
FIG. 7 is a photographic image showing a quantum dot-binder dispersion prepared in Comparative Example 3.

The photographic image of the prepared composition is shown in FIG. 7.

FIG. 7 confirms that the aforementioned binder solution cannot disperse the quantum dots.

Figure 8:
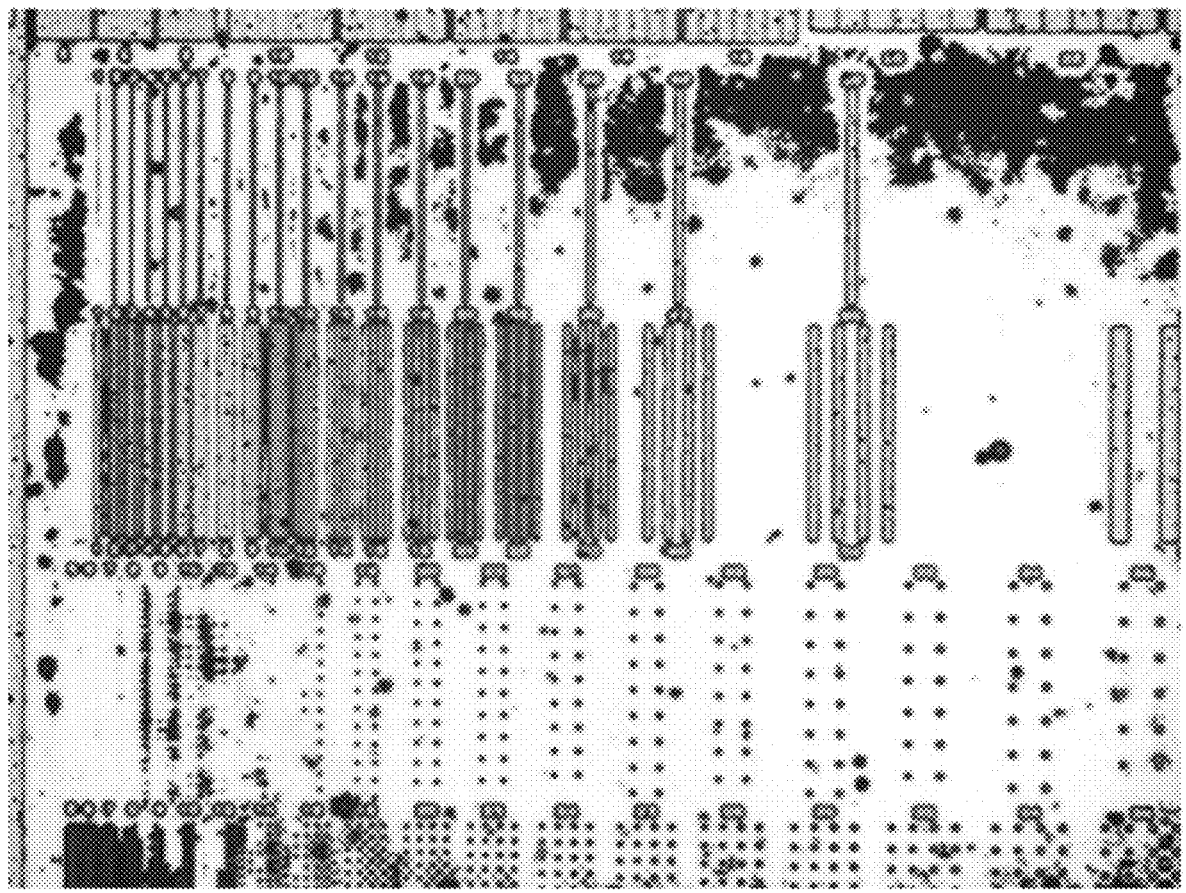
FIG. 8 is an optical microscope photograph of the quantum dot-polymer composite pattern prepared in Comparative Example 3.

The photographic image of the prepared pattern is shown in FIG. 8. FIG. 8 confirms that when the quantum dots fail to be uniformly dispersed in the photosensitive composition, a desired pattern of the quantum dot-polymer composite cannot be obtained.

Comparative Example 4

A photosensitive composition is prepared to form a pattern in accordance with the same procedure as in Example 1, except that 100 g of the binder solution (concentration 30 wt %, polypropylene glycol monomethyl ether acetate) includes a binder resin having the same repeating units and an acid value of 60 mg KOH/g, and no reactive compound is used.

It is confirmed that in the prepared composition, the quantum dots are not dispersed well and are significantly agglomerated, and by using the prepared composition, a desired pattern of the quantum dot polymer composite cannot be obtained.

Example 5

A photosensitive composition is prepared to form a pattern in accordance with the same procedure as in Example 1, except that 100 g of green light emitting quantum dots and 30 g of $TiO_2$ are used. The blue light conversion rate of the formed pattern is measured and the results are shown in FIG. 9.

Comparative Example 5

A photosensitive composition is prepared to form a pattern in accordance with the same procedure as in Comparative Example 1, except that 100 g of the quantum dots is used and 30 g of $TiO_2$ is added. The blue light conversion rate of the formed pattern is measured and the results are shown in FIG. 9.

Figure 9:
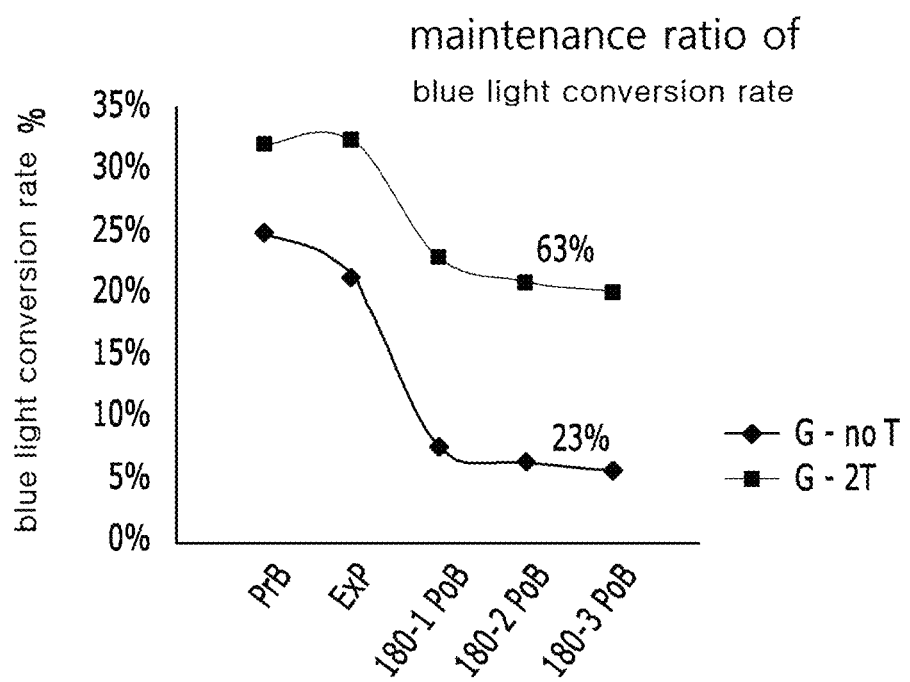
FIG. 9 is a view showing a graph plotting blue light conversion rate (percent, %) versus heat treating times (i.e., a process maintenance rate) in Example 5.

The results of FIG. 9 confirm that after three 30 min heat-treatments at 180° C., the quantum dot polymer composite pattern prepared from the composition including the reactive compound may show a maintenance ratio of the blue light conversion rate that is three times that of the quantum dot polymer composite pattern prepared from the composition with no reactive compound.

Examples 6 to 8 and Comparative Example 6: Stability Test Depending on the Amount of the Quantum Dots A photosensitive composition is prepared to form a pattern in accordance with the same procedure as in Example 1, except that green light emitting quantum dots (InP/ZnS) are used and the amount of the reactive compound, 2T, is changed to 0 g (Comparative Example 6), 5 g (Example 6), 10 g (Example 7), and 30 g (Example 8), respectively. The blue light conversion rate for each of the prepared quantum dot polymer composite patterns is measured, and the results are shown in FIG. 10.

Figure 10:
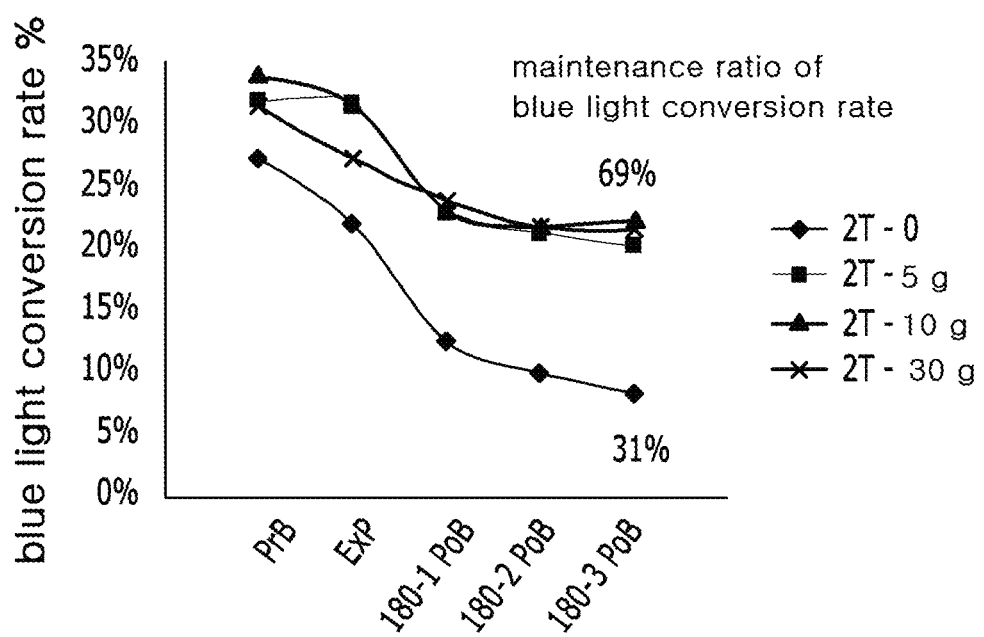
FIG. 10 is a view showing a graph plotting blue light conversion rate (percent, %) versus heat treating times (i.e., a process maintenance rate) in Example 6.

The results of FIG. 10 confirm that after three 30 min heat-treatments at 180° C., the quantum dot polymer composite pattern prepared from the composition including the reactive compound may show a maintenance ratio of the blue light conversion rate that is at least two times higher than that of the quantum dot polymer composite pattern prepared from the composition with no reactive compound.

Comparative Examples 7 to 9

A photosensitive composition is prepared to form a pattern in accordance with the same procedure as in Example 1, except that no reactive compound is used (Comparative Example 1), or as a reactive compound, 10 g of a compound having one thiol group such as octadecyl thiol, methyl 3-mercaptopropionate (1T(H), Comparative Example 7), 1-dodecanethiol (1T(D) Comparative Example 8), and 3-methoxybutyl mercaptoacetate (1T(A), Comparative Example 9) or 10 g of a compound having two thiol groups (i.e., 2T) is used. The blue light conversion rate for each of the prepared quantum dot polymer composite patterns is measured, and the results are shown in FIG. 12.

Figure 12:
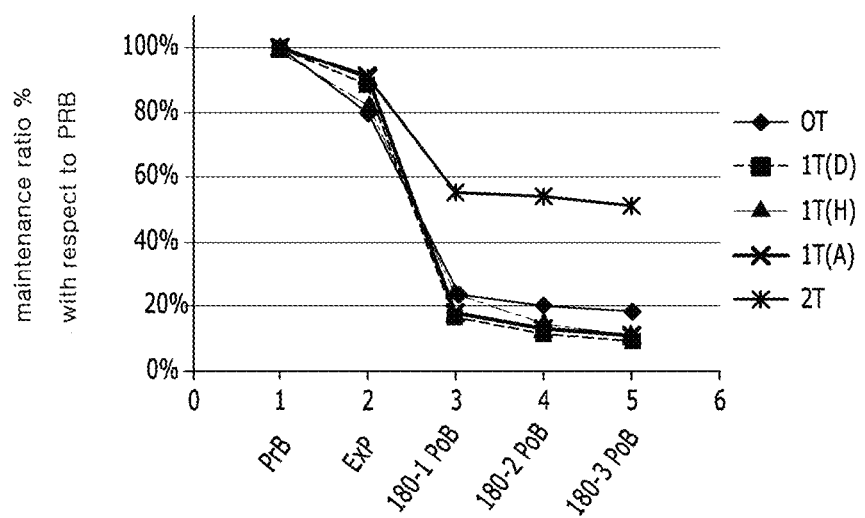
FIG. 12 is a view showing a graph of photoconversion rate (percent, %) with respect to that of the film after PrB versus heat treating times, illustrating the effects of the number of thiol groups on the quantum dot-polymer composite pattern.

The results of FIG. 12 confirm that the compound having one thiol group does not have an effect of increasing the process maintenance ratio.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot-polymer composite pattern comprising a first quantum dot-polymer composite, wherein the first quantum dot-polymer composite comprises:
    a matrix comprising a carboxylic acid group-containing polymer and a polymerization product of a photopolymerizable monomer comprising a carbon-carbon double bond and a reactive compound comprising at least two thiol groups; and
    a plurality of quantum dots;
    wherein the first quantum dot-polymer composite is configured to emit a first light,
    wherein the carboxylic acid group-containing polymer comprises a copolymer of a monomer combination comprising a first monomer comprising a carboxylic acid group and a carbon-carbon double bond and a second monomer comprising a carbon-carbon double bond and a hydrophobic moiety and not comprising a carboxylic acid group; and
    wherein the plurality of quantum dots are dispersed in the matrix, and
    wherein the quantum dot comprises an organic ligand, and wherein the organic ligand comprises RCOOH, $RNH_2$, $R_2NH$, $R_3N$, RSH, $R_3PO$, $R_3P$, ROH, RCOOR', RPO$(OH)_2$, $R_2POOH$ (wherein R and R' are independently a C5 to C24 aliphatic hydrocarbon group or a C6 to C20 aromatic hydrocarbon group), or a combination thereof.

2. The quantum dot-polymer composite pattern of claim 1, wherein the copolymer is a linear polymer and the photopolymerizable monomer comprises a monomer comprising at least two (meth)acrylate groups and the polymerization product comprises a crosslinked polymer.

3. The quantum dot-polymer composite pattern of claim 1, wherein the carboxylic acid group-containing polymer has an acid value of greater than about 60 milligrams of KOH per gram.

4. The quantum dot-polymer composite pattern of claim 1, wherein the plurality of the quantum dot comprises a Group II-VI compound, a Group III-V compound, a Group IV-VI compound, a Group IV element or compound, a Group compound, a Group I-II-IV-VI compound, or a combination thereof.

5. The quantum dot-polymer composite pattern of claim 1, wherein in the first quantum dot polymer composite, an amount of the plurality of the quantum dots is greater than or equal to about 5 wt % based on a total weight of the first quantum dot polymer composite.

6. The quantum dot-polymer composite pattern of claim 1, wherein the copolymer comprises a first repeating unit derived from the first monomer and a second repeating unit derived from the second monomer, and the first repeating unit comprises a repeating unit represented by Chemical Formula 1-1, a repeating unit represented by Chemical Formula 1-2, or a combination thereof:

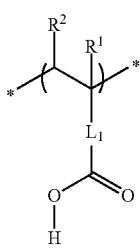

Chemical Formula 1-1 wherein
$R^1$ is hydrogen, a C1 to C3 alkyl group, or —$(CH_2)_{n1}$—COOH (wherein n1 is 0 to 2),
$R^2$ is hydrogen, a C1 to C3 alkyl group, or —COOH,
$L_1$ is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group, and
* indicates a portion linked to an adjacent atom;

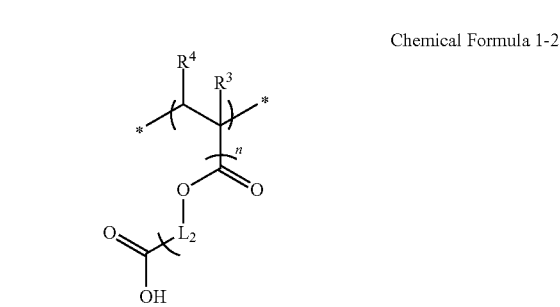

Chemical Formula 1-2 wherein
$R^3$ is hydrogen, a C1 to C3 alkyl group, or —$(CH_2)_{n1}$—COOH (wherein n1 is 0 to 2),
$R^4$ is hydrogen or a C1 to C3 alkyl group,
$L_2$ is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
n is an integer of 1 to 3, and
* indicates a portion linked to an adjacent atom;
the second repeating unit comprises a repeating unit represented by Chemical Formula 2, a repeating unit represented by Chemical Formula 4, a repeating unit represented by Chemical Formula 5, a repeating unit represented by Chemical Formula A, or a combination thereof:

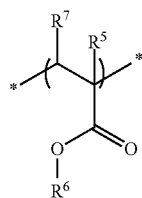

Chemical Formula 2 wherein
$R^5$ is hydrogen or a C1 to C3 alkyl group,
$R^6$ is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
$R^7$ is hydrogen or a C1 to C3 alkyl group, and
* indicates a portion linked to an adjacent atom;

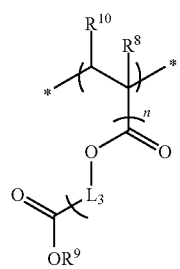

Chemical Formula 4 wherein
$R^8$ is hydrogen or a C1 to C3 alkyl group,
$L_3$ is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
$R^9$ is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
$R^{10}$ is hydrogen or a C1 to C3 alkyl group,
n is an integer of 1 to 3, and
* indicates a portion linked to an adjacent atom;

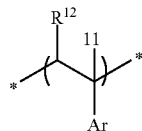

Chemical Formula 5 wherein
each of $R^{11}$ and $R^{12}$ is independently hydrogen or a C1 to C3 alkyl group, Ar is a substituted or unsubstituted C6 to C30 aromatic hydrocarbon group or a substituted or unsubstituted C6 to C30 alicyclic hydrocarbon group, and
* indicates a portion linked to an adjacent atom;

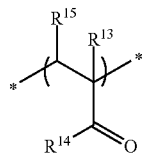

Chemical Formula A wherein
$R^{13}$ is hydrogen or a C1 to C3 alkyl group,
$R^{14}$ is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
$R^{15}$ is hydrogen or a C1 to C3 alkyl group, and
* indicates a portion linked to an adjacent atom.

7. The quantum dot-polymer composite pattern of claim 1, wherein the monomer combination further comprises a third monomer comprising a carbon-carbon double bond and a hydrophilic moiety and not comprising a carboxylic acid group.

8. The quantum dot-polymer composite pattern of claim 6, wherein the copolymer further comprises a third repeating unit derived from the third monomer, and the third repeating unit is represented by Chemical Formula 3:

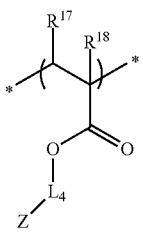

Chemical Formula 3 each of $R^{16}$ and $R^{17}$ is independently hydrogen or a C1 to C3 alkyl group, $L_4$ is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C6 to C30 alicyclic hydrocarbon group,
Z is a hydroxyl group (—OH), a mercapto group (—SH), or an amino group (—NHR$^a$, wherein R$^a$ is hydrogen or a C1 to C5 alkyl group), and
* indicates a portion linked to an adjacent atom.

9. The quantum dot-polymer composite pattern of claim 5, wherein in the copolymer, the amount of the first repeating unit is greater than or equal to about 5 mole percent and less than or equal to about 95 mole percent.

10. The quantum dot-polymer composite pattern of claim 1, wherein the carboxylic acid group-containing polymer comprises a copolymer of a first monomer selected from (meth)acrylic acid and at least one second monomer and optionally third monomer selected from arylalkyl(meth) acrylate, hydroxyalkyl (meth)acrylate, and styrene.

11. The quantum dot-polymer composite pattern of claim 1, wherein the reactive compound comprises a compound represented by Chemical Formula 6:

Chemical Formula 6 wherein, in Chemical Formula 6,
$R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a C1 to C10 alkoxy group, a hydroxy group, —NH$_2$, a substituted or unsubstituted C1 to C30 amine group (—NR$^{1a}$R$^{1a'}$, wherein R$^{1a}$ and R$^{1a'}$ are independently hydrogen or a C1 to C30 linear or branched alkyl group), an isocyanate group, a halogen, —R$^2$OR$^{2'}$ (wherein R 2 is a substituted or unsubstituted C1 to C20 alkylene group and R$^{2'}$ is hydrogen or a C1 to C20 linear or branched alkyl group), an acyl halide (—R$^3$C(=O)X, wherein R$^3$ is a substituted or unsubstituted C1 to C20 alkylene group and X is a halogen), —C(=O)OR$^{4'}$ (wherein R$^{4'}$ is hydrogen or a C1 to C20 linear or branched alkyl group), —CN, —C(=O) ONR$^5$R$^{5'}$ (wherein R$^5$ and R$^{5'}$ are independently hydrogen or a C1 to C20 linear or branched alkyl group), or a combination thereof,
$L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—CH$_2$—) of the substituted or unsubstituted C1 to C30 alkylene group is optionally replaced by sulfonyl (—S(=O)$_2$—), carbonyl (—C (=O)—), ether (—O—), sulfide (—S—), sulfoxide (—S(=O)—), ester (—C(=O)O—), amide (—C (=O)NR$_6$—) (wherein R$^6$ is hydrogen or a C1 to C10 alkyl group), or a combination thereof,
$Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH$_2$—) is replaced by sulfonyl (—S (=O)$_2$—), carbonyl (—C(=O)—), ether (—O—), sulfide (—S—), sulfoxide (—S(=O)—), ester (—C(=O) O—), amide (—C(=O)NR$^7$—) (wherein R$^7$ is hydrogen or a C1 to C10 linear or branched alkyl group), imine (—NR$^8$—) (wherein R 8 is hydrogen or a C1 to C10 linear or branched alkyl group), or a combination thereof,
m is an integer of 1 or more,
k1 is 0 or an integer of 1 or more,
k2 is an integer of 1 or more,
provided that the sum of m and k2 is an integer of 3 or more,
provided that m does not exceed the valence of $Y_1$ when $Y_1$ is not a single bond, and provided that the sum of k1 and k2 does not exceed the valence of $L_1$.

12. The quantum dot-polymer composite pattern of claim 1, wherein the reactive compound comprises a compound represented by Chemical Formula 6-1:

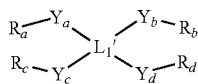

Chemical Formula 6-1 wherein
- $L_1'$ is carbon, a substituted or unsubstituted tetravalent C2 to C20 group derived from an alkane, a substituted or unsubstituted C6 to C30 group derived from an arene, a substituted or unsubstituted C3 to C30 group derived from a heteroarene, a substituted or unsubstituted C3 to C30 group derived from a cycloalkane, or a substituted or unsubstituted C3 to C30 group derived from a heterocycloalkane,
- each of $Y_a$ to $Y_d$ is independently a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene ($—CH_2—$) is replaced by sulfonyl ($—S(=O)_2—$), carbonyl ($—C(=O)—$), ether ($—O—$), sulfide ($—S—$), sulfoxide ($—S(=O)—$), ester ($—C(=O)O—$), amide ($—C(=O)NR^{11}—$) (wherein $R^{11}$ is hydrogen or a C1 to C10 linear or branched alkyl group), imine ($—NR^{22}—$) (wherein $R^{22}$ is hydrogen or a C1 to C10 linear or branched alkyl group), or a combination thereof, and
- each of $R_a$ to $R_d$ is independently $R^1$ or SH of Chemical Formula 6, provided that at least two of $R_a$ to $R_d$ are SH.

13. The quantum dot-polymer composite pattern of claim 1, wherein the reactive compound comprises ethoxylated pentaerythritol tetra(3-mercaptopropionate), trimethylolpropane tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, trimethylolpropane tris(3-mercaptopropionate), tris[2-(3-mercaptopropionyloxy)ethyl]isocyanurate, 1,3,5-tris(3-mercaptobutyl-oxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol comprising 1 to 10 ethylene glycol repeating units, or a combination thereof.

14. The quantum dot-polymer composite pattern of claim 1, wherein the first quantum dot polymer composite has a blue light conversion rate of greater than or equal to about % of an initial value thereof after a 30 minute heat-treatment at a temperature of 180° C.

15. The quantum dot-polymer composite pattern of claim 1, wherein the plurality of quantum dots show a quantum yield of greater than or equal to about 60% when being irradiated with an excitation light.

16. The quantum dot-polymer composite pattern of claim 1, wherein the first light is red light or green light.

17. The quantum dot-polymer composite pattern of claim 1, wherein the quantum dot-polymer composite pattern further comprises a second quantum dot polymer composite that is configured to emit a second light different from the first light.

18. A color filter comprising a quantum dot-polymer composite pattern of claim 1.

19. A display device comprising a quantum dot-polymer composite pattern of claim 1.

20. The display device of claim 19, wherein the device further comprises a light source providing the quantum dot-polymer composite pattern with an excitation light.

21. The display device of claim 20, wherein the excitation light comprises blue light.

\* \* \* \* \*